US012727316B2

(12) United States Patent
Watabe et al.

(10) Patent No.: US 12,727,316 B2
(45) Date of Patent: Sep. 1, 2026

(54) LIGHT-EMITTING DEVICE, LIGHT-EMITTING APPARATUS, LIGHT-EMITTING MODULE, ELECTRONIC DEVICE, AND LIGHTING DEVICE

(71) Applicant: Semiconductor Energy Laboratory Co., Ltd., Kanagawa-ken (JP)

(72) Inventors: Takeyoshi Watabe, Atsugi (JP); Airi Ueda, Sagamihara (JP); Nobuharu Ohsawa, Zama (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 555 days.

(21) Appl. No.: 17/612,299

(22) PCT Filed: May 18, 2020

(86) PCT No.: PCT/IB2020/054664
§ 371 (c)(1),
(2) Date: Nov. 18, 2021

(87) PCT Pub. No.: WO2020/240330
PCT Pub. Date: Dec. 3, 2020

(65) Prior Publication Data

US 2022/0223812 A1 Jul. 14, 2022

(30) Foreign Application Priority Data

May 31, 2019 (JP) ................................ 2019-102034

(51) Int. Cl.
*H10K 50/11* (2023.01)
*H10K 59/12* (2023.01)
(Continued)

(52) U.S. Cl.
CPC ............ *H10K 50/11* (2023.02); *H10K 59/12* (2023.02); *H10K 59/122* (2023.02);
(Continued)

(58) Field of Classification Search
CPC .... H10K 50/11; H10K 59/122; H10K 85/342; H10K 85/615; H10K 85/626;
(Continued)

(56) References Cited

U.S. PATENT DOCUMENTS

| | | | |
|---|---|---|---|
| 7,355,340 | B2 | 4/2008 | Shitagaki et al. |
| 7,807,839 | B2 | 10/2010 | Inoue et al. |

(Continued)

FOREIGN PATENT DOCUMENTS

| | | |
|---|---|---|
| CN | 107851727 A | 3/2018 |
| CN | 108140740 A | 6/2018 |

(Continued)

OTHER PUBLICATIONS

Light Emitting Diode Technologies Radiometric vs. Photometric Units 2006.*

(Continued)

*Primary Examiner* — Ori Nadav
(74) *Attorney, Agent, or Firm* — Husch Blackwell LLP

(57) ABSTRACT

A light-emitting device that emits near-infrared light and emits visible light that is less likely to be seen is provided. The light-emitting device contains a light-emitting organic compound and a host material in a light-emitting layer. The maximum peak wavelength in an emission spectrum of the light-emitting device is greater than or equal to 750 nm and less than or equal to 900 nm. A luminance A and a radiance B of the light-emitting device satisfy $0 \leq A/B \leq 1$.

18 Claims, 9 Drawing Sheets

(51) Int. Cl.

| | |
|---|---|
| *H10K 59/122* | (2023.01) |
| *H10K 85/30* | (2023.01) |
| *H10K 85/60* | (2023.01) |
| *H10K 101/00* | (2023.01) |
| *H10K 101/10* | (2023.01) |
| *H10K 101/20* | (2023.01) |
| *H10K 101/30* | (2023.01) |

(52) U.S. Cl.

CPC ......... *H10K 85/342* (2023.02); *H10K 85/615* (2023.02); *H10K 85/626* (2023.02); *H10K 85/631* (2023.02); *H10K 85/657* (2023.02); *H10K 85/6572* (2023.02); *H10K 85/6576* (2023.02); *H10K 2101/10* (2023.02); *H10K 2101/20* (2023.02); *H10K 2101/30* (2023.02); *H10K 2101/90* (2023.02)

(58) Field of Classification Search

CPC ............... H10K 85/631; H10K 85/657; H10K 85/6572; H10K 85/6576; H10K 2101/10; H10K 2101/30; H10K 2101/90; H10K 50/12; H10K 59/12; H10K 59/32; H10K 59/35; H10K 2101/20; H10K 2101/40; H10K 59/123; H10K 85/30; C07F 15/0033; G09F 9/30; H05B 33/02

USPC ............................................................ 257/40

See application file for complete search history.

(56) References Cited

U.S. PATENT DOCUMENTS

| | | | | |
|---|---|---|---|---|
| 9,921,670 | B2 | 3/2018 | Wang et al. | |
| 9,978,960 | B2 | 5/2018 | Inoue et al. | |
| 10,228,328 | B2 | 3/2019 | Adachi et al. | |
| 10,326,090 | B2 | 6/2019 | Bonrad et al. | |
| 10,367,148 | B2 | 7/2019 | Fujita. et al. | |
| 10,693,094 | B2 | 6/2020 | Seo et al. | |
| 11,444,248 | B2 | 9/2022 | Adachi et al. | |
| 2004/0233664 | A1* | 11/2004 | Beeson | G02B 19/0061 362/240 |
| 2016/0372688 | A1* | 12/2016 | Seo | H10K 85/342 |
| 2017/0025630 | A1* | 1/2017 | Seo | H10K 50/121 |
| 2017/0092890 | A1 | 3/2017 | Seo et al. | |
| 2017/0200901 | A1* | 7/2017 | Fujita | C09K 11/025 |
| 2018/0155380 | A1 | 6/2018 | Chi et al. | |
| 2018/0261773 | A1 | 9/2018 | Yamamoto et al. | |
| 2018/0287084 | A1 | 10/2018 | Park et al. | |
| 2019/0002488 | A1 | 1/2019 | Humphries et al. | |
| 2019/0002629 | A1 | 1/2019 | Islam et al. | |
| 2019/0062357 | A1 | 2/2019 | Yoo et al. | |
| 2019/0372028 | A1 | 12/2019 | Qiao et al. | |
| 2020/0350508 | A1 | 11/2020 | Seo et al. | |
| 2021/0320267 | A1 | 10/2021 | Seo et al. | |
| 2021/0351224 | A1 | 11/2021 | Yamazaki et al. | |
| 2021/0371427 | A1 | 12/2021 | Yamaguchi et al. | |

FOREIGN PATENT DOCUMENTS

| | | | | |
|---|---|---|---|---|
| CN | 108290915 | A | 7/2018 | |
| CN | 108368144 | A | 8/2018 | |
| CN | 109134550 | A | 1/2019 | |
| DE | 11 2016 003 313 | T5 | 4/2018 | |
| DE | 11 2016 004 502 | T5 | 7/2018 | |
| EP | 3151299 | A | 4/2017 | |
| EP | 3 390 418 | A | 10/2018 | |
| EP | 3 390 419 | A | 10/2018 | |
| GB | 2549246 | A | 10/2017 | |
| JP | 2007-137872 | A | 6/2007 | |
| JP | 2012-060094 | A | 3/2012 | |
| JP | 2015-228460 | A | 12/2015 | |
| JP | 2017-108108 | A | 6/2017 | |
| JP | 2017-168803 | A | 9/2017 | |
| JP | 2018-092993 | A | 6/2018 | |
| JP | 2018-093175 | A | 6/2018 | |
| JP | 2018-125434 | A | 8/2018 | |
| JP | 2019-501997 | | 1/2019 | |
| KR | 2018-0033177 | A | 4/2018 | |
| KR | 2018-0059843 | A | 6/2018 | |
| KR | 2018-0091089 | A | 8/2018 | |
| KR | 2018-0094975 | A | 8/2018 | |
| KR | 2019-0059284 | A | 5/2019 | |
| TW | 201711243 | | 3/2017 | |
| TW | 201721922 | | 6/2017 | |
| WO | WO 2017/013534 | A1 | 1/2017 | |
| WO | WO 2017/055963 | A1 | 4/2017 | |
| WO | WO 2017/103584 | A1 | 6/2017 | |
| WO | WO 2017/103586 | A1 | 6/2017 | |
| WO | WO-2018066583 | A1 * | 4/2018 | C07F 15/00 |

OTHER PUBLICATIONS

International Search Report (Application No. PCT/IB2020/054664) Dated Sep. 1, 2020.

Written Opinion (Application No. PCT/IB2020/054664) Dated Sep. 1, 2020.

Kim, Y. et al., "Structural and Photoluminescent Properties of Near-Infrared Emissive Bis(2,3-Diphenylbenzoquinoxalinato)(2-Pyrazinecarboxylato)ridium(III)," Bulletin of the Korean Chemical Society, Jan. 8, 2018, vol. 39, No. 1, pp. 133-136.

Chen, G. et al., "Cationic IrIII Emitters with Near-Infrared Emission Beyond 800 nm and Their Use in Light-Emitting Electrochemical Cells," Chemistry a European Journal, Feb. 14, 2019, vol. 25, No. 21, pp. 5489-5497.

Guo, J. et al., "Two Efficient Near-Infrared (NIR) Luminescent [Ir(C^N)2(N^O)]-Characteristic Complexes with 8-hydroxyquinoline (8-Hq) as the Ancillary Ligand," Inorganic Chemistry Communications, Jan. 15, 2019, vol. 101, pp. 69-73, Elsevier.

Zampetti, A. et al., "Highly Efficient Solid-State Near-infrared Organic Light-Emitting Diodes incorporating A-D-A Dyes based on α,β-unsubstituted "Bodipy" Moieties," Scientific Reports, May 9, 2017, vol. 7, No. 1611, pp. 1-7.

* cited by examiner

FIG. 2A
416
406
Y2
X1
Y1
X2
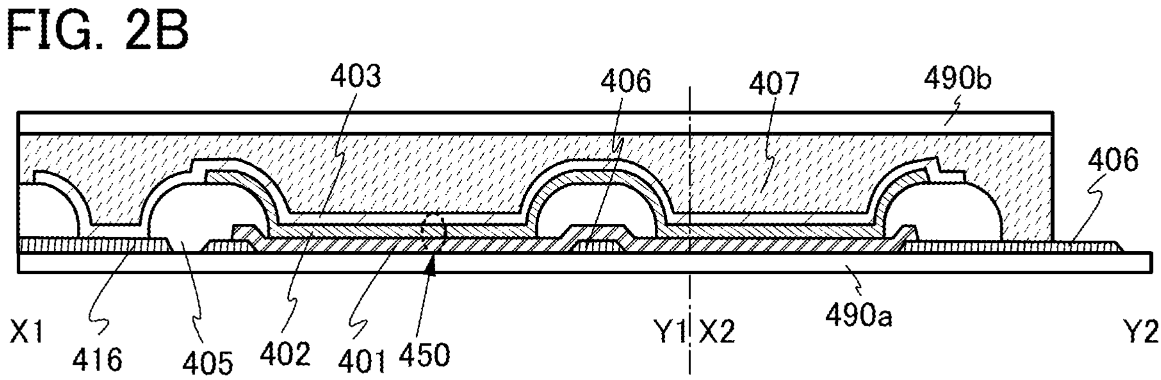
FIG. 2B
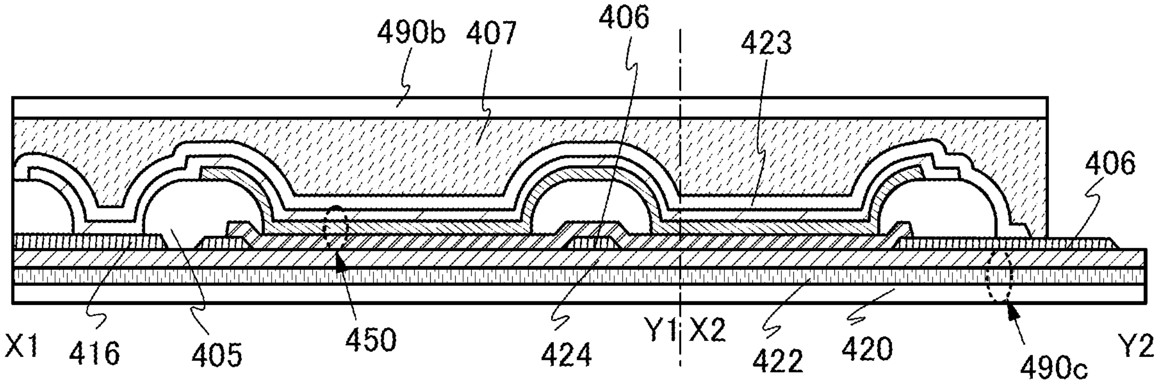
FIG. 2C

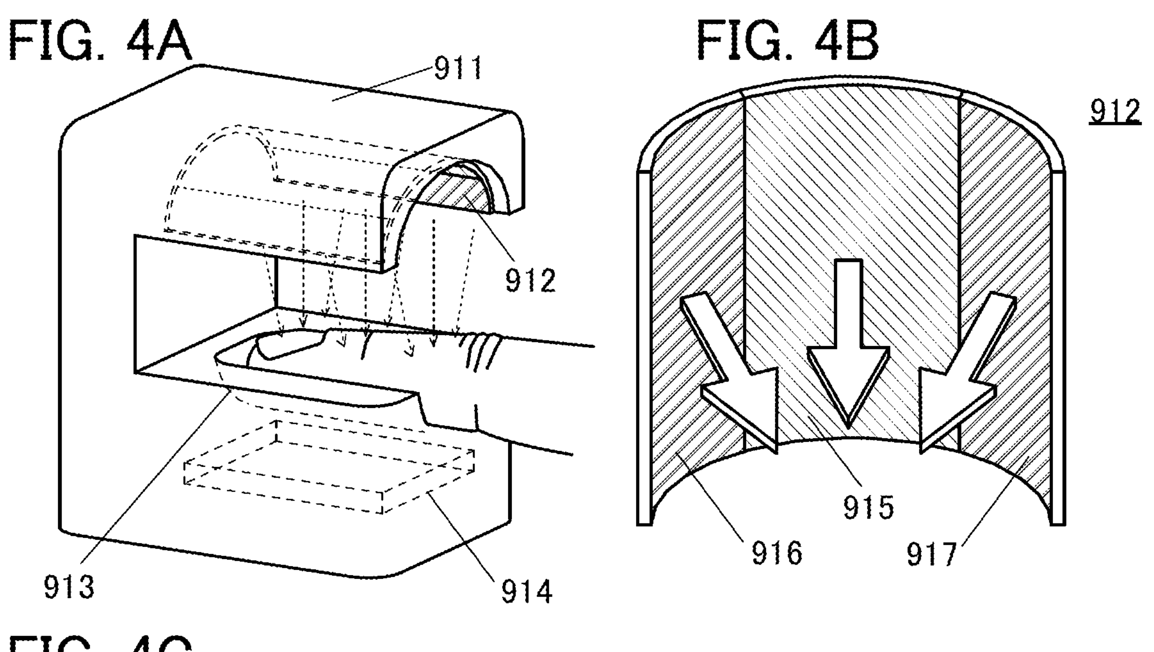
FIG. 4A
911
912
913
914
FIG. 4B
912
915
916
917
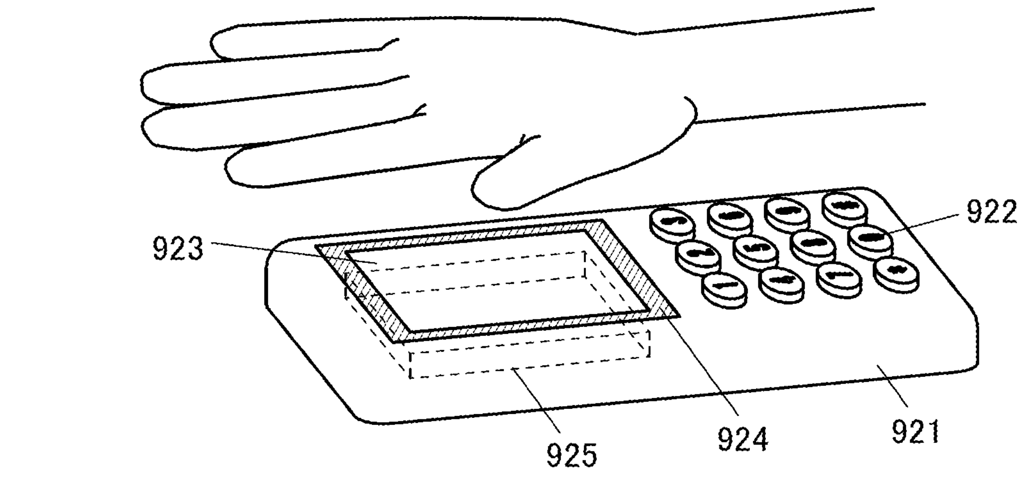
FIG. 4C
921
922
923
924
925
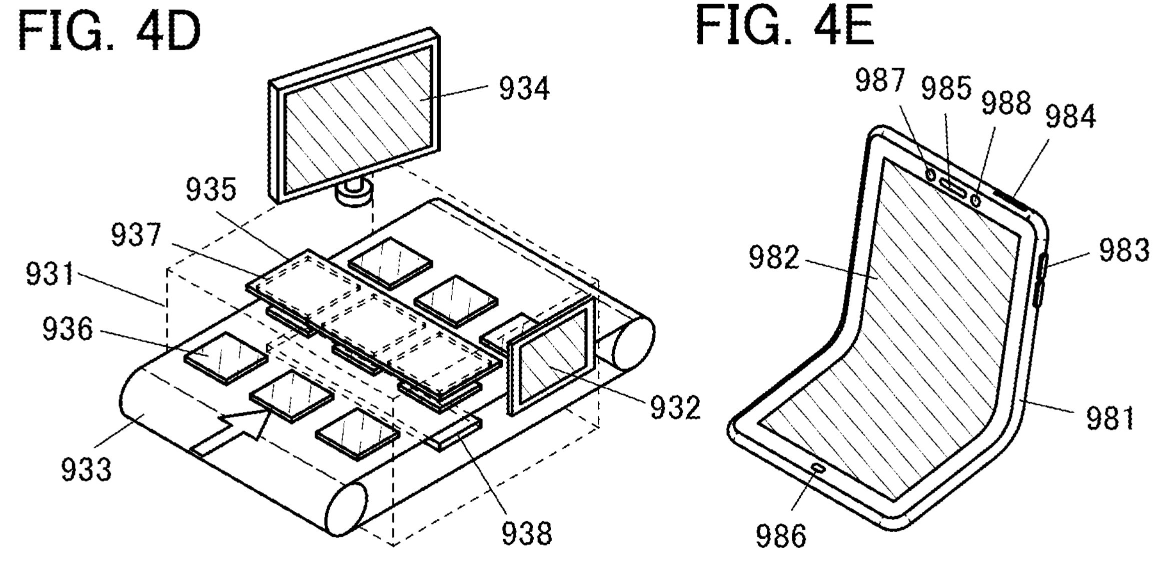
FIG. 4D
931
932
933
934
935
936
937
938
FIG. 4E
981
982
983
984
985
986
987
988

LIGHT-EMITTING DEVICE, LIGHT-EMITTING APPARATUS, LIGHT-EMITTING MODULE, ELECTRONIC DEVICE, AND LIGHTING DEVICE

This application is a 371 of international application PCT/IB2020/054664 filed on May 18, 2020 which is incorporated herein by reference.

TECHNICAL FIELD

One embodiment of the present invention relates to a light-emitting device, a light-emitting apparatus, a light-emitting module, an electronic device, and a lighting device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Research and development have been actively conducted on light-emitting devices using an organic electroluminescence (EL) phenomenon (also referred to as organic EL devices or organic EL elements). In a basic structure of an organic EL device, a layer containing a light-emitting organic compound (hereinafter, also referred to as a light-emitting layer) is sandwiched between a pair of electrodes. By application of voltage to the organic EL device, light emitted from the light-emitting organic compound can be obtained.

An example of the light-emitting organic compound is a compound capable of converting a triplet excited state into light (also referred to as a phosphorescent compound or a phosphorescent material). As a phosphorescent material, Patent Document 1 discloses an organometallic complex that contains iridium or the like as a central metal.

Image sensors have been used in a variety of applications such as personal authentication, defect analysis, medical diagnosis, and security. The wavelength of light sources used for image sensors is different depending on applications. Light having a variety of wavelengths, for example, light having a short wavelength, such as visible light and X-rays, and light having a long wavelength, such as near-infrared light, is used for image sensors.

Light-emitting devices have been considered to be used as light sources of image sensors such as the above in addition to display devices.

REFERENCE

Patent Document

[Patent Document 1] Japanese Published Patent Application No. 2007-137872

SUMMARY OF THE INVENTION

Problems to be Solved by the Invention

An object of one embodiment of the present invention is to provide a light-emitting device that emits near-infrared light and emits visible light that is less likely to be seen. An object of one embodiment of the present invention is to enhance the emission efficiency of a light-emitting device that emits near-infrared light. An object of one embodiment of the present invention is to enhance the reliability of a light-emitting device that emits near-infrared light.

Note that the description of these objects does not preclude the existence of other objects. One embodiment of the present invention does not need to achieve all these objects. Other objects can be derived from the description of the specification, the drawings, and the claims.

Means for Solving the Problems

One embodiment of the present invention is a light-emitting device containing a light-emitting organic compound and a host material in a light-emitting layer. The maximum peak wavelength in an emission spectrum is greater than or equal to 750 nm and less than or equal to 900 nm. A luminance A [$cd/m^2$] and a radiance B [$W/sr/m^2$] satisfy $0 \leq A/B \leq 1$ [cd·sr/W].

One embodiment of the present invention is a light-emitting device containing a light-emitting organic compound and a host material in a light-emitting layer. The maximum peak wavelength in an emission spectrum is greater than or equal to 750 nm and less than or equal to 900 nm. A luminance A [$cd/m^2$] and a radiance B [$W/sr/m^2$] satisfy $0 < A/B \leq 1$ [cd·sr/W].

A difference between the HOMO level and the LUMO level of the host material is preferably greater than or equal to 1.35 eV and less than or equal to 2.25 eV.

The host material preferably contains a first organic compound and a second organic compound. The HOMO level of the first organic compound is preferably higher than the HOMO level of the second organic compound. A difference between the HOMO level of the first organic compound and the LUMO level of the second organic compound is preferably smaller than a difference between the HOMO level and the LUMO level of the light-emitting organic compound. The first organic compound and the second organic compound are preferably substances that form an exciplex. The difference between the HOMO level of the first organic compound and the LUMO level of the second organic compound is preferably greater than or equal to 1.35 eV and less than or equal to 2.25 eV.

One embodiment of the present invention is a light-emitting device containing a light-emitting organic compound and a host material in a light-emitting layer. The maximum peak wavelength in an emission spectrum is greater than or equal to 750 nm and less than or equal to 900 nm. The HOMO level of the host material is higher than the HOMO level of the light-emitting organic compound by 0.4 eV or more. A difference between the HOMO level and the LUMO level of the host material is smaller than a difference between the HOMO level and the LUMO level of the light-emitting organic compound. The difference between the HOMO level and the LUMO level of the host material is preferably greater than or equal to 1.35 eV and less than or equal to 2.25 eV.

One embodiment of the present invention is a light-emitting device containing a light-emitting organic compound and a host material in a light-emitting layer. The maximum peak wavelength in an emission spectrum is greater than or equal to 750 nm and less than or equal to 900 nm. The host material contains a first organic compound and a second organic compound. The HOMO level of the first organic compound is higher than the HOMO level of the light-emitting organic compound by 0.4 eV or more. The HOMO level of the first organic compound is higher than the HOMO level of the second organic compound. A difference between the HOMO level of the first organic compound and the LUMO level of the second organic compound is smaller than a difference between the HOMO level and the LUMO level of the light-emitting organic compound. The first organic compound and the second organic compound are preferably substances that form an exciplex. The difference between the HOMO level of the first organic compound and the LUMO level of the second organic compound is preferably greater than or equal to 1.35 eV and less than or equal to 2.25 eV.

A rising wavelength of the maximum peak on a short wavelength side in the emission spectrum is preferably greater than or equal to 650 nm.

A rising wavelength of the maximum peak on a short wavelength side in a PL spectrum of the light-emitting organic compound in a solution is preferably greater than or equal to 650 nm.

The external quantum efficiency of the light-emitting device is preferably greater than or equal to 1%.

The light-emitting organic compound is preferably an organometallic complex having a metal-carbon bond.

The organometallic complex preferably includes a condensed heteroaromatic ring including 2 to 5 rings. The condensed heteroaromatic ring is preferably coordinated to metal.

The light-emitting organic compound is preferably a cyclometalated complex. The light-emitting organic compound is preferably an orthometalated complex. The light-emitting organic compound is preferably an iridium complex.

One embodiment of the present invention is a light-emitting apparatus that includes the light-emitting device having any of the above-described structures, and one or both of a transistor and a substrate.

One embodiment of the present invention is a light-emitting module including the above-described light-emitting apparatus, where a connector such as a flexible printed circuit (hereinafter, referred to as FPC) or a TCP (Tape Carrier Package) is attached or an integrated circuit (IC) is mounted by a COG (Chip On Glass) method, a COF (Chip On Film) method, or the like. Note that the light-emitting module of one embodiment of the present invention may include only one of a connector and an IC or may include both of them.

One embodiment of the present invention is an electronic device including the above-described light-emitting module and at least one of an antenna, a battery, a housing, a camera, a speaker, a microphone, and an operation button.

One embodiment of the present invention is a lighting device including the above-described light-emitting apparatus and at least one of a housing, a cover, and a support.

Effect of the Invention

According to one embodiment of the present invention, a light-emitting device that emits near-infrared light and emits visible light that is less likely to be seen can be provided. According to one embodiment of the present invention, the emission efficiency of a light-emitting device that emits near-infrared light can be enhanced. According to one embodiment of the present invention, the reliability of a light-emitting device that emits near-infrared light can be enhanced.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 2A is a top view illustrating an example of a light-emitting apparatus. FIG. 2B and FIG. 2C are cross-sectional views illustrating examples of the light-emitting apparatus.

FIG. 4A to FIG. 4E are diagrams illustrating examples of electronic devices.

MODE FOR CARRYING OUT THE INVENTION

Figure 1A:
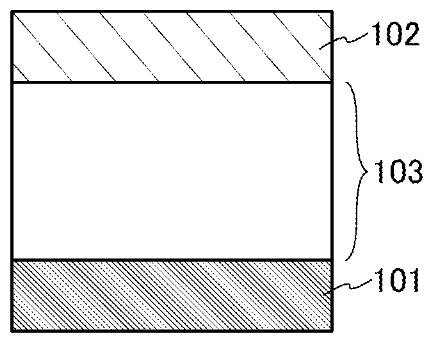
FIG. 1A to FIG. 1C are diagrams illustrating examples of light-emitting devices.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and description thereof is not repeated. Furthermore, the same hatch pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term “film” and the term “layer” can be interchanged with each other depending on the case or circumstances. For example, the term “conductive layer” can be changed into the term “conductive film”. As another example, the term “insulating film” can be changed into the term “insulating layer”.

Embodiment 1

In this embodiment, a light-emitting device of one embodiment of the present invention will be described with reference to FIG. 1.

The light-emitting device of one embodiment of the present invention contains a light-emitting organic compound (also referred to as a guest material) and a host material in a light-emitting layer.

In the light-emitting device of one embodiment of the present invention, the maximum peak wavelength (wavelength having the highest peak intensity) in an emission spectrum (electroluminescence (EL) spectrum) is greater than or equal to 750 nm and less than or equal to 900 nm, preferably greater than or equal to 780 nm and less than or equal to 880 nm.

In the light-emitting device of one embodiment of the present invention, a luminance A [$cd/m^2$] and a radiance B [$W/sr/m^2$] preferably satisfy $0 \leq A/B \leq 1$ [cd·sr/W]. Alternatively, the luminance A [$cd/m^2$] and the radiance B [$W/sr/m^2$] preferably satisfy $0 < A/B \leq 1$ [cd·sr/W].

When the luminance and the radiance satisfy the above formula, a light-emitting device that emits visible light that is less likely to be seen and emits near-infrared light efficiently can be provided.

In a light-emitting device using a guest material that emits near-infrared light, emission of visible light derived from a host material is observed in some cases. In order to make the light emitted from the host material less likely to be seen, the light emitted from the host material is preferably light having a wavelength of a low luminosity factor.

Examples of the light having a wavelength of a low luminosity factor include ultraviolet light to blue light and red light to near-infrared light. For example, in the case where the light-emitting device emits light that is derived from the host material and is any of the above light, visible light is less likely to be seen. It can be specifically said that the emission spectrum of the light-emitting device of one embodiment of the present invention may further have a peak at 435 nm or less, or at 565 nm to 900 nm inclusive. The wavelength of the peak is preferably greater than or equal to 600 nm and less than or equal to 800 nm.

Here, in the case where the guest material is a substance exhibiting phosphorescence (phosphorescent material), an absorption band that is considered to contribute to light emission most greatly is an absorption wavelength corresponding to direct transition from a singlet ground state to a triplet excitation state and the vicinity thereof, i.e., an absorption band appearing on the longest wavelength side (lowest energy side). Therefore, it is considered preferable that emission spectra (a fluorescence spectrum and a phosphorescence spectrum) of the host material largely overlap with the longest-wavelength-side (lowest-energy-side) absorption band in the absorption spectrum of the phosphorescent material. Thus, transfer of excitation energy from the host material to the guest material is performed smoothly. Then, excitation energy of the host material is converted into excitation energy of the guest material, whereby the guest material emits light efficiently.

Thus, the emission wavelength of the host material is preferably a long wavelength in order that the guest material can emit near-infrared light efficiently. When light emitted from the host material has a long wavelength, a light-emitting device that emits visible light (derived from the host material) that is less likely to be seen and emits near-infrared light efficiently. In particular, the light emitted from the host material is preferably red light to near-infrared light because the luminosity factor of the light derived from the host material can be low and excitation energy can be efficiently transferred from the host material to the guest material.

The HOMO level of the host material is preferably higher than the HOMO level of the guest material by 0.4 eV or more. When the HOMO level of the host material is sufficiently higher than the HOMO level of the guest material, the band gap of the host material can be small and thus long-wavelength light emission is possible. Thus, the luminosity factor of the light emitted from the host material can be low. Furthermore, excitation energy can be efficiently transferred from the host material to the guest material, which enables a light-emitting device that emits near-infrared light efficiently.

Note that the LUMO level and the HOMO level of the material can be derived from the electrochemical characteristics (the reduction potential and the oxidation potential) of the material that are measured by cyclic voltammetry (CV).

A difference between the HOMO level and the LUMO level of the host material is preferably smaller than a difference between the HOMO level and the LUMO level of the guest material. A small difference between the HOMO level and the LUMO level of the host material also enables the host material to emit long-wavelength light. Specifically, the difference between the HOMO level and the LUMO level of the host material is preferably greater than or equal to 1.35 eV and less than or equal to 2.25 eV. The difference between the levels is preferably greater than or equal to 1.55 eV and less than or equal to 1.90 eV.

Here, in the case where a phosphorescent material is used as the guest material, the emission efficiency of the light-emitting device can be enhanced when the $T_1$ level (the energy level of the lowest triplet excited state) of the host material is higher than the $T_1$ level of the guest material. Meanwhile, the host material can convert singlet excitation energy into light emission. The $S_1$ level (the energy level of the lowest singlet excited state) of the host material is higher than both the $T_1$ level of the host material and the $T_1$ level of the guest material. A difference between the $T_1$ level of the guest material and the $S_1$ level of the host material is preferably small in order that the light emitted from the host material is red light to near-infrared light. That is, the difference between the $S_1$ level and the $T_1$ level of the host material is preferably small. A thermally activated delayed fluorescence (TADF) material has a small difference between the $S_1$ level and the $T_1$ level and thus can be suitably used as the host material.

Alternatively, a first organic compound and a second organic compound may be used as the host material to form an exciplex. The combination of the first organic compound and the second organic compound forms an exciplex. In this case, the host material can be regarded as a mixed material of the first organic compound and the second organic compound. With the use of the first organic compound and the second organic compound as the host material, an exciplex is formed when voltage is applied between a pair of electrodes in the light-emitting device.

An exciplex whose excited state is formed by two kinds of substances has an extremely small difference between the $S_1$ level and the $T_1$ level and functions as a TADF material that can convert triplet excitation energy into singlet excitation energy.

In the case where the host material contains the first organic compound and the second organic compound, light emission derived from an exciplex formed by the first organic compound and the second organic compound is observed from the light-emitting device of one embodiment of the present invention. Accordingly, in order that light emitted from the exciplex is less likely to be seen, the light emitted from the exciplex is preferably light with a low luminosity factor.

Here, the case where the heights of the energy levels are in the order of the HOMO level of the second organic compound<the HOMO level of the first organic compound<the LUMO level of the second organic compound<the LUMO level of the first organic compound is considered. In this case, in the exciplex formed by the two organic compounds, the LUMO level is derived from the second organic compound and the HOMO level is derived from the first organic compound.

Accordingly, the HOMO level of the first organic compound is preferably higher than the HOMO level of the guest material by 0.4 eV or more. When the HOMO level of the first organic compound is sufficiently higher than the HOMO level of the guest material, the exciplex can emit long-wavelength light. Consequently, the luminosity factor of the exciplex can be low. Furthermore, excitation energy can be efficiently transferred from the exciplex to the guest material, which enables a light-emitting device that emits near-infrared light efficiently.

A difference between the HOMO level of the first organic compound and the LUMO level of the second organic compound is preferably smaller than a difference between the HOMO level and the LUMO level of the guest material. A small difference between the HOMO level of the first organic compound and the LUMO level of the second organic compound also enables the exciplex to emit long-wavelength light. Specifically, the difference between the HOMO level of the first organic compound and the LUMO level of the second organic compound is preferably greater than or equal to 1.35 eV and less than or equal to 2.25 eV. The difference between the levels is preferably greater than or equal to 1.55 eV and less than or equal to 1.90 eV.

The guest material preferably has a low emission intensity in the visible light region. Thus, in the light-emitting device of one embodiment of the present invention, a rising wavelength of the maximum peak on a short wavelength side in the emission spectrum is preferably greater than or equal to 650 nm.

A way of obtaining the rising wavelength in this specification and the like is described. First, a tangent at each point on a curve is drawn in order from a point on a short wavelength side in the emission spectrum in a linear scale, to a shortest-wavelength-side local maximum point of the local maximum points in the spectrum. The slope of the tangent becomes steep as the curve rises (the value of the vertical axis increases). A wavelength where the tangent drawn at a point at which the slope has a local maximum value on the shortest wavelength side intersects the horizontal axis which is the straight line with the spectral radiance of 0 is regarded as the rising wavelength. Note that a local maximum point at which the value of the vertical axis is less than or equal to 10% of that of the maximum peak is not included as the shortest-wavelength-side local maximum point.

The rising wavelength of the maximum peak on a short wavelength side in the photoluminescence (PL) spectrum of the light-emitting organic compound (guest material) in a solution is preferably greater than or equal to 650 nm.

The external quantum efficiency of the light-emitting device of one embodiment of the present invention is preferably greater than or equal to 1%.

Since the emission intensity of the host material or the exciplex is sufficiently low in the light-emitting device of one embodiment of the present invention, the external quantum efficiency can be regarded as the external quantum efficiency calculated from the light emission derived from the guest material in the light-emitting device or the external quantum efficiency calculated from the near-infrared light emission in the light-emitting device. In order to calculate the external quantum efficiency of the light derived from the guest material or the near-infrared light in the light-emitting device, for example, the external quantum efficiency may be calculated using data of a given wavelength range. Specifically, the external quantum efficiency may be calculated from data of a wavelength range of 600 nm to 1030 nm inclusive.

Alternatively, the external quantum efficiency may be calculated after waveform separation of the emission spectrum is performed to distinguish the light emission derived from the guest material from the light emission derived from the host material or the exciplex. In this case, the external quantum efficiency calculated from the light emission derived from the guest material in the light-emitting device of one embodiment of the present invention is preferably greater than or equal to 1%. Alternatively, the external quantum efficiency calculated from the near-infrared light emission in the light-emitting device of one embodiment of the present invention is preferably greater than or equal to 1%.

The light-emitting organic compound preferably exhibits phosphorescence, in which case the emission efficiency of the light-emitting device can be increased. The light-emitting organic compound is particularly preferably an organometallic complex having a metal-carbon bond. In particular, the light-emitting organic compound is further preferably a cyclometalated complex. Furthermore, the light-emitting organic compound is preferably an orthometalated complex. These organic compounds are likely to exhibit phosphorescence, and thus can increase the emission efficiency of the light-emitting device. Consequently, the light-emitting device of one embodiment of the present invention preferably exhibits phosphorescence.

The organometallic complex having a metal-carbon bond is suitable for the light-emitting organic compound because of its higher emission efficiency and higher chemical stability than a porphyrin-based compound and the like.

In the case where the light-emitting organic compound is used as the guest material and another organic compound is used as the host material in the light-emitting layer, when a deep trough appears (a portion with a low intensity appears) in the absorption spectrum of the light-emitting organic compound, excitation energy is not transferred smoothly from the host material to the guest material and the energy transfer efficiency is lowered, depending on the value of excitation energy of the host material. Here, in the absorption spectrum of the organometallic complex having a metal-carbon bond, many absorption bands, such as an absorption band derived from triplet MLCT (Metal to Ligand Charge Transfer) transition, an absorption band derived from singlet MLCT transition, and an absorption band derived from triplet $\pi$-$\pi^*$ transition, overlap each other; hence, a deep trough is less likely to appear in the absorption spectrum. Thus, the range of the value of excitation energy of the material that can be used as the host material can be widened, and the range of choices for the host material can be widened.

In addition, the light-emitting organic compound is preferably an iridium complex. For example, the light-emitting organic compound is preferably a cyclometalated complex using iridium as the central metal. Since the iridium complex has higher chemical stability than a platinum complex and the like, the use of the iridium complex as the light-emitting organic compound can increase the reliability of the light-emitting device. In terms of such stability, a cyclometalated complex of iridium is preferable, and an orthometalated complex of iridium is further preferable.

From the viewpoint of obtaining near-infrared light emission, the ligand of the above organometallic complex preferably has a structure in which a condensed heteroaromatic ring including 2 to 5 rings is coordinated to a metal. The condensed heteroaromatic ring preferably includes 3 or more rings. Moreover, the condensed heteroaromatic ring preferably includes 4 or less rings. As the number of rings included in the condensed heteroaromatic ring increases, the LUMO level can be lower and the wavelength of light emitted from the organometallic complex can be longer. Meanwhile, as the number of condensed heteroaromatic rings decreases, the sublimability can be increased. Consequently, by employing a condensed heteroaromatic ring including 2 to 5 rings, the LUMO level of the ligand is adequately lowered, and the wavelength of light that is emitted from the organometallic complex and derived from the (triplet) MLCT transition can be increased to the near-infrared wavelength while high sublimability is maintained. In addition, as the number of nitrogen atoms (N) included in the condensed heteroaromatic ring increases, the LUMO level can be lower. Therefore, the number of nitrogen atoms (N) included in the condensed heteroaromatic ring is preferably two or more, particularly preferably two.

The light-emitting device of one embodiment of the present invention can be formed into a film shape and is easily increased in area, and thus can be used as a planar light source that emits near-infrared light.

The light-emitting device of one embodiment of the present invention emits visible light that is less likely to be seen and can emit near-infrared light efficiently. The use of such a light-emitting device makes it possible to achieve an electronic device that performs authentication, analysis, diagnosis, or the like with near-infrared light. In the electronic device, visible light emitted from the light-emitting device can be inhibited from being noise in authentication, analysis, diagnosis, or the like using near-infrared light. Thus, the accuracy of authentication, analysis, diagnosis, or the like can be improved. In addition, with an electronic device for security use, military use, or the like, image capturing using near-infrared light can be conducted unnoticeably.

[Structure Example of Light-Emitting Device]

<<Basic Structure of Light-Emitting Device>>

Figure 1B:
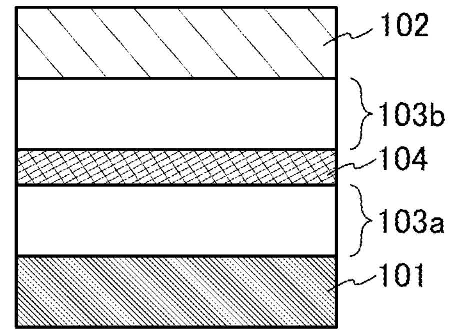
Figure 1C:
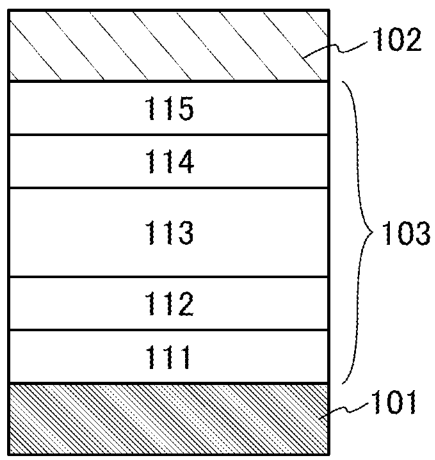

FIG. 1A to FIG. 1C illustrate examples of a light-emitting device including an EL layer between a pair of electrodes.

The light-emitting device illustrated in FIG. 1A has a structure in which an EL layer 103 is provided between a first electrode 101 and a second electrode 102 (a single structure). The EL layer 103 includes at least a light-emitting layer.

The light-emitting device may include a plurality of EL layers between a pair of electrodes. FIG. 1B illustrates a light-emitting device having a tandem structure in which two EL layers (an EL layer 103*a* and an EL layer 103*b*) are provided between a pair of electrodes and a charge-generation layer 104 is provided between the two EL layers. The light-emitting device having a tandem structure can be driven at low voltage and have low power consumption.

The charge-generation layer 104 has a function of injecting electrons into one of the EL layer 103*a* and the EL layer 103*b* and injecting holes into the other of the EL layers when voltage is applied to the first electrode 101 and the second electrode 102. Thus, in FIG. 1B, when voltage is applied such that the potential of the first electrode 101 is higher than that of the second electrode 102, the charge-generation layer 104 injects electrons into the EL layer 103*a* and injects holes into the EL layer 103*b*.

Note that in terms of light extraction efficiency, the charge-generation layer 104 preferably transmits near-infrared light (specifically, the transmittance of near-infrared light of the charge-generation layer 104 is preferably greater than or equal to 40%). The charge-generation layer 104 functions even when having lower conductivity than the first electrode 101 and the second electrode 102.

FIG. 1C illustrates an example of a stacked-layer structure of the EL layer 103. In this embodiment, the case where the first electrode 101 functions as an anode and the second electrode 102 functions as a cathode is described as an example. The EL layer 103 has a structure in which a hole-injection layer 111, a hole-transport layer 112, a light-emitting layer 113, an electron-transport layer 114, and an electron-injection layer 115 are stacked in this order over the first electrode 101. Each of the hole-injection layer 111, the hole-transport layer 112, the light-emitting layer 113, the electron-transport layer 114, and the electron-injection layer 115 may have a single-layer structure or a stacked-layer structure. Note that in the case where a plurality of EL layers are provided as in the tandem structure illustrated in FIG. 1B, each of the EL layers can have a stacked-layer structure similar to that of the EL layer 103 illustrated in FIG. 1C. When the first electrode 101 serves as a cathode and the second electrode 102 serves as an anode, the stacking order is reversed.

The light-emitting layer 113 contains a light-emitting substance and a plurality of substances in appropriate combination, whereby fluorescence or phosphorescence with a desired wavelength can be obtained. The EL layer 103*a* and the EL layer 103*b* illustrated in FIG. 1B may exhibit different wavelengths.

The light-emitting device of one embodiment of the present invention may have a structure in which light obtained from the EL layer is resonated between the pair of electrodes in order to intensify the light. For example, when the first electrode 101 is a reflective electrode (an electrode having a property of reflecting near-infrared light) and the second electrode 102 is a transflective electrode (an electrode having properties of transmitting and reflecting near-infrared light) in FIG. 1C to form a micro optical resonator (microcavity) structure, light emission obtained from the EL layer 103 can be intensified.

Note that in the case where the first electrode 101 of the light-emitting device is a reflective electrode having a stacked-layer structure of a conductive film having a property of reflecting near-infrared light and a conductive film having a property of transmitting near-infrared light, optical adjustment can be performed by controlling the thickness of the conductive film having the transmitting property. Specifically, when the wavelength of light obtained from the light-emitting layer 113 is $\lambda$, the distance between the first electrode 101 and the second electrode 102 is preferably adjusted to be in the neighborhood of $m\lambda/2$ (m is a natural number).

To amplify desired light (wavelength: $\lambda$) obtained from the light-emitting layer 113, the optical path length from the first electrode 101 to a region where the desired light is obtained in the light-emitting layer 113 (a light-emitting region) and the optical path length from the second electrode 102 to the region where the desired light is obtained in the light-emitting layer 113 (a light-emitting region) are preferably adjusted to be in the neighborhood of $(2m'+1)\lambda/4$ (m' is a natural number). Here, the light-emitting region refers to a region where holes and electrons are recombined in the light-emitting layer 113.

By performing such optical adjustment, the spectrum of light obtained from the light-emitting layer 113 can be narrowed, and light with a desired wavelength can be obtained.

Note that in the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer from which the desired light is obtained is, to be exact, the optical path length between the reflective region in the first electrode 101 and the light-emitting region in the light-emitting layer from which the desired light is obtained. However, it is difficult to precisely determine the reflective region in the first electrode 101 and the light-emitting region in the light-emitting layer from which the desired light is obtained; thus, it is assumed that the above effect can be sufficiently obtained with a given position in the first electrode 101 being supposed to be the reflective region and a given position in the light-emitting layer from which the desired light is obtained being supposed to be the light-emitting region.

At least one of the first electrode 101 and the second electrode 102 has a property of transmitting near-infrared light. The transmittance of near-infrared light of the electrode having a property of transmitting near-infrared light is greater than or equal to 40%. In the case where the electrode having a property of transmitting near-infrared light is the above-described transflective electrode, the reflectance of near-infrared light of the electrode is greater than or equal to 20%, preferably greater than or equal to 40% and less than 100%, preferably less than or equal to 95%, and may be less than or equal to 80% or less than or equal to 70%. For example, the reflectance of near-infrared light of the electrode is greater than or equal to 20% and less than or equal to 80%, preferably greater than or equal to 40% and less than or equal to 70%. The electrode preferably has a resistivity less than or equal to $1\times10^{-2}$ Ωcm.

In the case where the first electrode 101 or the second electrode 102 is a reflective electrode, the reflectance of near-infrared light of the reflective electrode is greater than or equal to 40% and less than or equal to 100%, preferably greater than or equal to 70% and less than or equal to 100%. The electrode preferably has a resistivity less than or equal to $1\times10^{-2}$ Ωcm.

<<Specific Structure and Fabrication Method of Light-Emitting Device>>

Next, a specific structure and a fabrication method of the light-emitting device will be described. Here, the light-emitting device having the single structure illustrated in FIG. 1C is used for the description.

<First Electrode and Second Electrode>

As materials for forming the first electrode 101 and the second electrode 102, any of the following materials can be used in an appropriate combination as long as the functions of the electrodes described above can be fulfilled. For example, a metal, an alloy, an electrically conductive compound, a mixture of these, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, and the like.

Note that when a light-emitting device having a microcavity structure is formed, the first electrode 101 is formed as a reflective electrode and the second electrode 102 is formed as a transflective electrode. Thus, a single layer or stacked layers can be formed using one or more desired conductive materials. Note that the second electrode 102 is formed after formation of the EL layer 103, with the use of a material selected as described above. For fabrication of these electrodes, a sputtering method or a vacuum evaporation method can be used.

When the first electrode 101 is an anode in the light-emitting device illustrated in FIG. 1C, the hole-injection layer 111 and the hole-transport layer 112 are sequentially stacked over the first electrode 101 by a vacuum evaporation method.

<Hole-Injection Layer and Hole-Transport Layer>

The hole-injection layer 111 is a layer injecting holes from the first electrode 101 serving as the anode to the EL layer 103, and is a layer containing a material with a high hole-injection property.

As the material having a high hole-injection property, a transition metal oxide such as molybdenum oxide, vanadium oxide, ruthenium oxide, tungsten oxide, or manganese oxide or a phthalocyanine-based compound such as phthalocyanine (abbreviation: $H_2Pc$) or copper phthalocyanine (abbreviation: CuPc) can be used, for example.

As the material having a high hole-injection property, it is possible to use, for example, an aromatic amine compound such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

As the material having a high hole-injection property, it is possible to use, for example, poly(N-vinylcarbazole) (abbreviation: PVK), poly(4-vinyltriphenylamine) (abbreviation:

PVTPA), poly[N-(4-{N'-[4-(4-diphenylamino)phenyl]phenyl-N'-phenylamino}phenyl)methacryl amide] (abbreviation: PTPDMA), or poly[N,N'-bis(4-butylphenyl)-N,N'-bis(phenyl)benzidine] (abbreviation: Poly-TPD). Alternatively, it is also possible to use, for example, a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

As the material having a high hole-injection property, a composite material containing a hole-transport material and an acceptor material (an electron-accepting material) can also be used. In this case, the acceptor material extracts electrons from the hole-transport material, so that holes are generated in the hole-injection layer 111 and the holes are injected into the light-emitting layer 113 through the hole-transport layer 112. Note that the hole-injection layer 111 may be formed using a single layer of a composite material containing a hole-transport material and an acceptor material, or may be formed using a stack including a layer of a hole-transport material and a layer of an acceptor material.

The hole-transport layer 112 is a layer transporting holes, which are injected from the first electrode 101 by the hole-injection layer 111, to the light-emitting layer 113. The hole-transport layer 112 is a layer containing a hole-transport material. It is particularly preferable that the HOMO level of the hole-transport material used in the hole-transport layer 112 be the same as or close to the HOMO level of the hole-injection layer 111.

As the acceptor material used for the hole-injection layer 111, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used. Examples of materials having an electron-withdrawing group (halogen group or cyano group) include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyano-naphthoquinodimethane (abbreviation: F6-TCNNQ). A compound in which electron-withdrawing groups are bonded to a condensed aromatic ring having a plurality of heteroatoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferable; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The hole-transport materials used for the hole-injection layer 111 and the hole-transport layer 112 are preferably substances with a hole mobility greater than or equal to $10^{-6}$ $cm^2/Vs$. Note that other substances can also be used as long as they have a property of transporting more holes than electrons.

As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

Examples of the carbazole derivative (a compound having a carbazole skeleton) include a bicarbazole derivative (e.g., a 3,3'-bicarbazole derivative) and aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), PCzPCA1, PCzPCA2, PCzPCN1, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the thiophene derivative (a compound having a thiophene skeleton) and the furan derivative (a compound having a furan skeleton) include compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), 4,4',4"-(benzene-1,3,5-triyl)tri(dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino] spiro-9,9'-bifluorene (abbreviation: DPA2SF), 4,4',4"-tris[N-(1-naphthyl)-N-phenylamino]triphenylamine (abbreviation: 1'-TNATA), TDATA, m-MTDATA, N,N'-di(p-tolyl)-N,N'-diphenyl-p-phenylenediamine (abbreviation: DTDPPA), DPAB, DNTPD, and DPA3B.

As the hole-transport material, a high molecular compound such as PVK, PVTPA, PTPDMA, or Poly-TPD can also be used.

The hole-transport material is not limited to the above examples, and one of or a combination of various known materials can be used as the hole-transport material in the hole-injection layer 111 and the hole-transport layer 112.

In the light-emitting device illustrated in FIG. 1C, the light-emitting layer 113 is formed over the hole-transport layer 112 by a vacuum evaporation method.

<Light-Emitting Layer>

The light-emitting layer 113 is a layer containing a light-emitting substance.

The light-emitting device of one embodiment of the present invention contains a light-emitting organic compound as the light-emitting substance. The light-emitting organic compound emits near-infrared light. Specifically, the maximum peak wavelength of light emitted from the light-emitting organic compound is greater than 750 nm and less than or equal to 900 nm.

As the light-emitting organic compound, an organometallic complex that will be described as a guest material (phosphorescent material) in a later example, bis{4,6-dimethyl-2-[3-(3,5-dimethylphenyl)-2-benzo[g] quinoxalinyl-κN]phenyl-κC}(2,2,6,6-tetramethyl-3,5-heptanedionato-$\kappa^2$O,O')iridium(III) (abbreviation: $[Ir(dmdpbq)_2(dpm)]$), can be used, for example.

Alternatively, as the light-emitting organic compound, tetraphenyltetrabenzo porphyrin platinum(II) can be used, for example.

The light-emitting layer 113 can contain one or more kinds of light-emitting substances.

The light-emitting layer 113 contains one or more kinds of organic compounds (a host material) in addition to a light-emitting substance (a guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting substance that can be used for the light-emitting layer 113, and it is possible to use a light-emitting substance that converts singlet excitation energy into light in the near-infrared light range or a light-emitting substance that converts triplet excitation energy into light in the near-infrared light range.

As an example of the light-emitting substance that converts singlet excitation energy into light, a substance that exhibits fluorescence (a fluorescent material) can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the light-emitting substance converting triplet excitation energy into light include a substance emitting phosphorescence (phosphorescent material) and a TADF material exhibiting thermally activated delayed fluorescence.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

As the host material used in the light-emitting layer 113, one or more kinds of substances having a larger energy gap than the light-emitting substance can be used.

In the case where the light-emitting substance used in the light-emitting layer 113 is a fluorescent material, an organic compound used in combination with the light-emitting substance is preferably an organic compound that has a high energy level in a singlet excited state and has a low energy level in a triplet excited state.

In the case where the light-emitting substance is a fluorescent material, examples of the organic compound that can be used in combination with the light-emitting substance include fused polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound (the host material) used in combination with the fluorescent material include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), PCPN, 9,10-diphenylanthracene (abbreviation: DPAnth), N,N'-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N'",N'"-octaphenyldibenzo[g,p]chrysene-2,7,10,15-tetraamine (abbreviation: DBC1), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}anthracene (abbreviation: FLPPA), 9,10-bis(3,5- diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9϶-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

In the case where the light-emitting substance is a phosphorescent material, as the organic compound used in combination with the light-emitting substance, an organic compound that has higher triplet excitation energy (energy difference between a ground state and a triplet excited state) than the light-emitting substance is selected.

In the case where a plurality of organic compounds (e.g., a first host material and a second host material) are used in combination with the light-emitting substance in order to form an exciplex, the plurality of organic compounds are preferably mixed with a phosphorescent material (particularly an organometallic complex).

Such a structure makes it possible to efficiently obtain light emission utilizing ExTET (Exciplex-Triplet Energy Transfer), which is energy transfer from an exciplex to a light-emitting substance. Note that a combination of a plurality of organic compounds that easily forms an exciplex is preferable, and it is particularly preferable to combine a compound that easily accepts holes (a hole-transport material) and a compound that easily accepts electrons (an electron-transport material). As the hole-transport material and the electron-transport material, specifically, any of the materials described in this embodiment can be used. With the above structure, high efficiency, low voltage, and a long lifetime of the light-emitting device can be achieved at the same time.

In the case where the light-emitting substance is a phosphorescent material, examples of the organic compounds that can be used in combination with the light-emitting substance include an aromatic amine, a carbazole derivative, a dibenzothiophene derivative, a dibenzofuran derivative, a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

Among the above-described compounds, specific examples of the aromatic amine, (a compound having an aromatic amine skeleton), the carbazole derivative, the dibenzothiophene derivative (thiophene derivative), and the dibenzofuran derivative (furan derivative), which are organic compounds having a high hole-transport property, are the same as the compounds given above as specific examples of the hole-transport material.

Specific examples of the zinc- and aluminum-based metal complexes, which are organic compounds having a high electron-transport property, include metal complexes including a quinoline skeleton or a benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq).

A metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBT-BIm-II), 4,4'-bis(5-methylbenzoxazol-2-yl)stilbene (abbreviation: BzOs, bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDB q-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluorene-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 3,5-bis(3-(9H-carbazol-9-yl)phenyl)pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that has a small difference between the $S_1$ level and the $T_1$ level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission. Thermally activated delayed fluorescence is efficiently obtained under the condition where the difference in energy between the $S_1$ level and the $T_1$ level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

A phosphorescent spectrum observed at low temperatures (e.g., 77 K to 10 K) is used for an index of the $T_1$ level. When the level of energy with a wavelength of the line obtained by extrapolating a tangent to the fluorescent spectrum at a tail on the short wavelength side is the Si level and the level of energy with a wavelength of the line obtained by extrapolating a tangent to the phosphorescent spectrum at a tail on the short wavelength side is the $T_1$ level, the difference between the $S_1$ level and the $T_1$ level of the TADF material is preferably less than or equal to 0.3 eV, further preferably less than or equal to 0.2 eV.

The TADF material may be used as a guest material or may be used as a host material.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2$OEP).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a] carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H, 10'H-spiro [acridin-9,9'-anthracen]-10'-one (abbreviation: ACRSA). Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound. In particular, the TADF material can be used in combination with the host material, the hole-transport material, and the electron-transport material described above.

Furthermore, when used in combination with a low molecular material or a high molecular material, the above materials can be used to form the light-emitting layer 113. For the deposition, a known method (an evaporation method, a coating method, a printing method, or the like) can be used as appropriate.

In the light-emitting device illustrated in FIG. 1C, the electron-transport layer 114 is formed over the light-emitting layer 113.

<Electron-Transport Layer>

The electron-transport layer 114 is a layer that transports electrons, which are injected from the second electrode 102 by the electron-injection layer 115, to the light-emitting layer 113. Note that the electron-transport layer 114 is a layer containing an electron-transport material. The electron-transport material used in the electron-transport layer 114 is preferably a substance having an electron mobility higher than or equal to $1\times10^{-6}$ $cm^2$/Vs. Note that other substances can also be used as long as they have a property of transporting more electrons than holes.

As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

As specific examples of the electron-transport material, the above-described materials can be used.

Next, in the light-emitting device illustrated in FIG. 1C, the electron-injection layer 115 is formed over the electron-transport layer 114 by a vacuum evaporation method.

<Electron-Injection Layer>

The electron-injection layer 115 is a layer that contains a substance having a high electron-injection property. For the electron-injection layer 115, an alkali metal, an alkaline earth metal, or a compound thereof such as lithium fluoride (LiF), cesium fluoride (CsF), calcium fluoride ($CaF_2$), or lithium oxide ($LiO_x$) can be used. A rare earth metal compound such as erbium fluoride ($ErF_3$) can also be used. In addition, an electride may be used for the electron-injection layer 115. Examples of the electride include a substance in which electrons are added at high concentration to calcium oxide-aluminum oxide. Any of the above-described substances for forming the electron-transport layer 114 can also be used.

For the electron-injection layer 115, a composite material containing an electron-transport material and a donor material (an electron-donating material) may be used. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials used in the electron-transport layer 114 (e.g., a metal complex or a heteroaromatic compound) can be used. As the electron donor, a substance exhibiting a property of donating electrons to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

<Charge-Generation Layer>

In the light-emitting device illustrated in FIG. 1B, the charge-generation layer 104 has a function of injecting electrons into the EL layer 103_a_ and injecting holes into the EL layer 103_b_ when voltage is applied between the first electrode 101 (the anode) and the second electrode 102 (the cathode).

The charge-generation layer 104 may contain a hole-transport material and an acceptor material (an electron-accepting material) or may contain an electron-transport material and a donor material. Forming the charge-generation layer 104 with such a structure can inhibit an increase in the driving voltage that would be caused by stacking EL layers.

As the hole-transport material, the acceptor material, the electron-transport material, and the donor material, the above-described materials can be used.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge-generation layer can be formed by an evaporation method (a vacuum evaporation method or the like), a coating method (a dip coating method, a die coating method, a bar coating method, a spin coating method, a spray coating method, or the like), a printing method (an ink-jet method, a screen printing (stencil) method, an offset printing (planography) method, a flexography (relief printing) method, a gravure printing method, a micro-contact printing method, or the like), or the like.

Materials of the functional layers included in the EL layer 103 and the charge-generation layer are not limited to the above-described corresponding materials. For example, as the materials of the functional layers, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) may be used. As the quantum dot material, a colloidal quantum dot material, an alloyed quantum dot material, a core-shell quantum dot material, a core quantum dot material, or the like can be used.

In the light-emitting device of one embodiment of the present invention, light emitted from the host material or the exciplex formed by the host material is less likely to be seen. Thus, a light-emitting device that emits visible light that is less likely to be seen and emits near-infrared light efficiently can be provided.

In the light-emitting device of one embodiment of the present invention, the luminance A [cd/m$^2$] and the radiance B [W/sr/m$^2$] satisfy $0 \leq A/B \leq 1$ [cd·sr/W] (or $0 < A/B \leq 1$ [cd·sr/W]). Thus, a light-emitting device that emits visible light that is less likely to be seen and emits near-infrared light efficiently can be provided.

This embodiment can be combined with the other embodiments as appropriate. In this specification, in the case where a plurality of structure examples are shown in one embodiment, the structure examples can be combined as appropriate.

Embodiment 2

In this embodiment, a light-emitting apparatus of one embodiment of the present invention will be described with reference to FIG. 2 and FIG. 3.

The light-emitting apparatus of this embodiment includes the light-emitting device described in Embodiment 1. Thus, a light-emitting apparatus that emits near-infrared light and emits visible light that is less likely to be seen can be provided.

Structure Example 1 of Light-Emitting Apparatus

FIG. 2A is a top view of a light-emitting apparatus, and FIG. 2B and FIG. 2C are cross-sectional views along dashed-dotted lines X1-Y1 and X2-Y2 in FIG. 2A. The light-emitting apparatus illustrated in FIG. 2A to FIG. 2C can be used as a lighting device, for example. The light-emitting apparatus can have a bottom-emission, top-emission, or dual-emission structure.

The light-emitting apparatus illustrated in FIG. 2B includes a substrate 490_a_, a substrate 490_b_, a conductive layer 406, a conductive layer 416, an insulating layer 405, an organic EL device 450 (a first electrode 401, an EL layer 402, and a second electrode 403), and an adhesive layer 407. As the organic EL device 450, the light-emitting device described in Embodiment 1 can be used.

The organic EL device 450 includes the first electrode 401 over the substrate 490_a_, the EL layer 402 over the first electrode 401, and the second electrode 403 over the EL layer 402. The organic EL device 450 is sealed by the substrate 490_a_, the adhesive layer 407, and the substrate 490_b_.

End portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 positioned therebetween functions as an auxiliary wiring and is electrically connected to the first electrode 401. It is preferable that the auxiliary wiring electrically connected to the electrode of the organic EL device 450 be provided, in which case a voltage drop due to the resistance of the electrode can be inhibited. The conductive layer 406 may be provided over the first electrode 401. An auxiliary wiring that is electrically connected to the second electrode 403 may be provided, for example, over the insulating layer 405.

For each of the substrate 490_a_ and the substrate 490_b_, glass, quartz, ceramic, sapphire, an organic resin, or the like can be used. When a flexible material is used for the substrate 490*a* and the substrate 490*b*, the flexibility of the light-emitting apparatus can be increased.

A light-emitting surface of the light-emitting apparatus may be provided with a light extraction structure for increasing the light extraction efficiency, an antistatic film inhibiting the attachment of a foreign substance, a water repellent film suppressing the attachment of stain, a hard coat film suppressing generation of a scratch in use, an impact absorption layer, or the like.

Examples of an insulating material that can be used for the insulating layer 405 include a resin such as an acrylic resin and an epoxy resin, and an inorganic insulating material such as silicon oxide, silicon oxynitride, silicon nitride oxide, silicon nitride, and aluminum oxide.

For the adhesive layer 407, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. Alternatively, an adhesive sheet or the like may be used.

The light-emitting apparatus illustrated in FIG. 2C includes a barrier layer 490*c*, the conductive layer 406, the conductive layer 416, the insulating layer 405, the organic EL device 450, the adhesive layer 407, a barrier layer 423, and the substrate 490*b*.

The barrier layer 490*c* illustrated in FIG. 2C includes a substrate 420, an adhesive layer 422, and an insulating layer 424 having a high barrier property.

In the light-emitting apparatus illustrated in FIG. 2C, the organic EL device 450 is provided between the insulating layer 424 having a high barrier property and the barrier layer 423. Thus, even when resin films with relatively low water resistance or the like are used as the substrate 420 and the substrate 490*b*, a reduction in lifetime due to entry of impurities such as water into the organic EL device can be inhibited.

For each of the substrate 420 and the substrate 490*b*, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used. Glass that is thin enough to have flexibility may be used for the substrate 420 and the substrate 490*b*.

An inorganic insulating film is preferably used as the insulating layer 424 having a high barrier property. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

The barrier layer 423 preferably includes at least a single-layer inorganic film. For example, the barrier layer 423 can have a single-layer structure of an inorganic film or a stacked-layer structure of an inorganic film and an organic film. As the inorganic film, the above-described inorganic insulating film is preferable. An example of the stacked-layer structure is a structure in which a silicon oxynitride film, a silicon oxide film, an organic film, a silicon oxide film, and a silicon nitride film are formed in this order. When the barrier layer has a stacked-layer structure of an inorganic film and an organic film, entry of impurities that can enter the organic EL device 450 (typically, hydrogen, water, and the like) can be suitably inhibited.

The insulating layer 424 having a high barrier property and the organic EL device 450 can be directly formed on the substrate 420 having flexibility. In that case, the adhesive layer 422 is not necessary. Alternatively, the insulating layer 424 and the organic EL device 450 can be formed over a rigid substrate with a separation layer provided therebetween and then transferred to the substrate 420. For example, the insulating layer 424 and the organic EL device 450 may be transferred to the substrate 420 in the following manner: the insulating layer 424 and the organic EL device 450 are separated from the rigid substrate by application of heat, force, laser light, or the like to the separation layer, and then the insulating layer 424 and the organic EL device 450 are bonded to the substrate 420 with the use of the adhesive layer 422. For the separation layer, a stacked-layer structure of inorganic films including a tungsten film and a silicon oxide film, or an organic resin film of polyimide or the like can be used, for example. In the case where a rigid substrate is used, the insulating layer 424 can be formed at high temperature as compared to the case where a resin substrate or the like is used; thus, the insulating layer 424 can have high density and an excellent barrier property.

Structure Example 2 of Light-Emitting Apparatus

The light-emitting apparatus of one embodiment of the present invention can be of passive matrix type or active matrix type. An active-matrix light-emitting apparatus will be described with reference to FIG. 3.

Figure 3A:
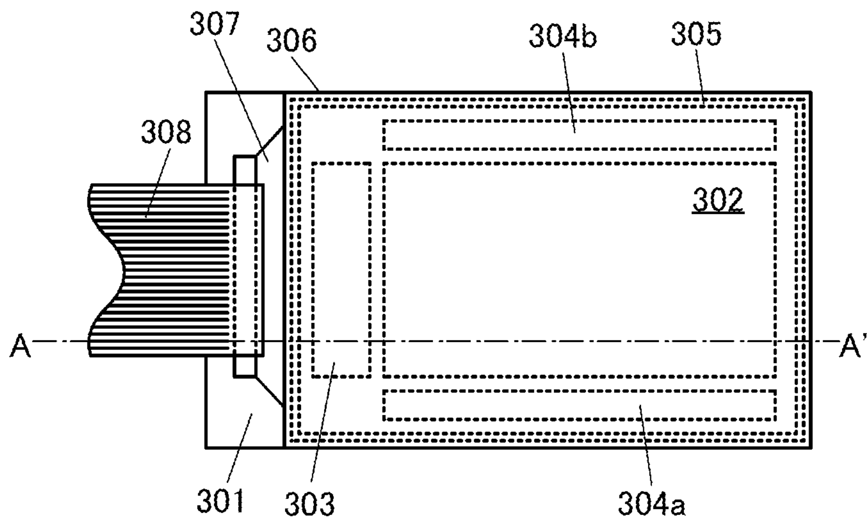
FIG. 3A is a top view illustrating an example of a light-emitting apparatus.
Figure 3B:
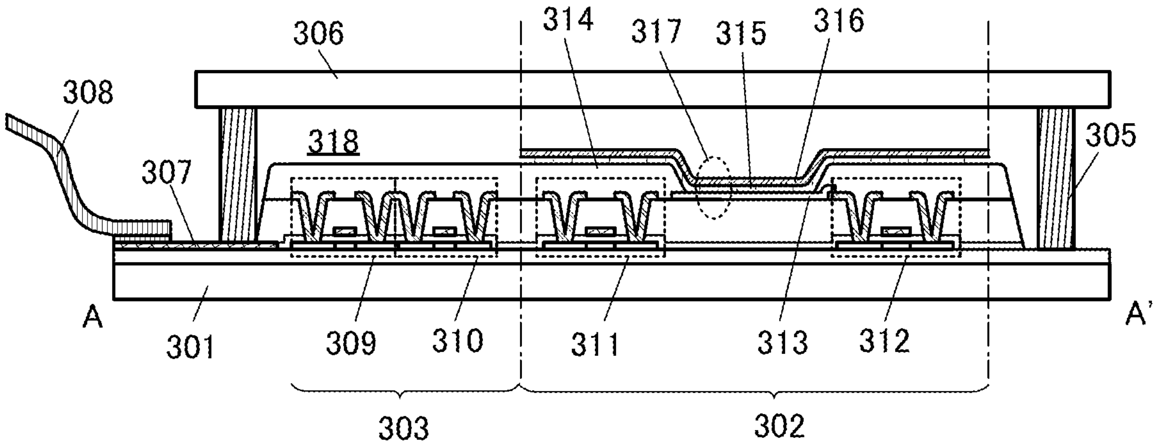
FIG. 3B is a cross-sectional view illustrating an example of the light-emitting apparatus.

FIG. 3A is a top view of the light-emitting apparatus. FIG. 3B is a cross-sectional view along dashed-dotted line A-A' in FIG. 3A.

The active-matrix light-emitting apparatus illustrated in FIG. 3A and FIG. 3B includes a pixel portion 302, a circuit portion 303, a circuit portion 304*a*, and a circuit portion 304*b*.

Each of the circuit portion 303, the circuit portion 304*a*, and the circuit portion 304*b* can function as a scan line driver circuit (a gate driver) or a signal line driver circuit (a source driver), or may be a circuit that electrically connects the pixel portion 302 to an external gate driver or source driver.

A lead wiring 307 is provided over a first substrate 301. The lead wiring 307 is electrically connected to an FPC 308 that is an external input terminal. The FPC 308 transmits signals (e.g., a video signal, a clock signal, a start signal, and a reset signal) and a potential from the outside to the circuit portion 303, the circuit portion 304*a*, and the circuit portion 304*b*. The FPC 308 may be provided with a printed wiring board (PWB). The structure illustrated in FIG. 3A and FIG. 3B can also be referred to as a light-emitting module including a light-emitting device (or a light-emitting apparatus) and an FPC.

The pixel portion 302 includes a plurality of pixels each including an organic EL device 317, a transistor 311, and a transistor 312. As the organic EL device 317, the light-emitting device described in Embodiment 1 can be used. The transistor 312 is electrically connected to a first electrode 313 included in the organic EL device 317. The transistor 311 functions as a switching transistor. The transistor 312 functions as a current control transistor. Note that the number of transistors included in each pixel is not particularly limited and can be set appropriately as needed.

The circuit portion 303 includes a plurality of transistors, such as a transistor 309 and a transistor 310. The circuit portion 303 may be configured with a circuit including transistors having the same conductivity type (either n-channel transistors or p-channel transistors), or may be configured with a CMOS circuit including an n-channel transistor and a p-channel transistor. Furthermore, a driver circuit may be provided outside.

There is no particular limitation on the structure of the transistor included in the light-emitting apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer where a channel is formed.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

It is preferable that the semiconductor layer of the transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

The transistors included in the circuit portion 303, the circuit portion 304*a*, and the circuit portion 304*b* and the transistors included in the pixel portion 302 may have the same structure or different structures. A plurality of transistors included in the circuit portion 303, the circuit portion 304*a*, and the circuit portion 304*b* may have the same structure or two or more kinds of structures. Similarly, a plurality of transistors included in the pixel portion 302 may have the same structure or two or more kinds of structures.

An end portion of the first electrode 313 is covered with an insulating layer 314. For the insulating layer 314, an organic compound such as a negative photosensitive resin or a positive photosensitive resin (acrylic resin), or an inorganic compound such as silicon oxide, silicon oxynitride, or silicon nitride can be used. An upper end portion or a lower end portion of the insulating layer 314 preferably has a curved surface with curvature. In that case, favorable coverage with a film formed over the insulating layer 314 can be obtained.

An EL layer 315 is provided over the first electrode 313, and a second electrode 316 is provided over the EL layer 315. The EL layer 315 includes a light-emitting layer, a hole-injection layer, a hole-transport layer, an electron-transport layer, an electron-injection layer, a charge-generation layer, and the like.

The plurality of transistors and the plurality of organic EL devices 317 are sealed by the first substrate 301, a second substrate 306, and a sealant 305. A space 318 surrounded by the first substrate 301, the second substrate 306, and the sealant 305 may be filled with an inert gas (e.g., nitrogen or argon) or an organic substance (including the sealant 305).

An epoxy resin or glass frit can be used for the sealant 305. A material that transmits moisture and oxygen as little as possible is preferably used for the sealant 305. In the case where glass frit is used for the sealant, the first substrate 301 and the second substrate 306 are preferably glass substrates in terms of adhesion.

This embodiment can be combined with the other embodiments as appropriate.

Embodiment 3

In this embodiment, electronic devices in which the light-emitting device of one embodiment of the present invention can be used will be described with reference to FIG. 4.

The light-emitting device of one embodiment of the present invention emits near-infrared light and emits visible light that is less likely to be seen. The use of such a light-emitting device makes it possible to achieve an electronic device that performs authentication, analysis, diagnosis, or the like with near-infrared light. In the electronic device, visible light emitted from the light-emitting device can be inhibited from being noise in authentication, analysis, diagnosis, or the like using near-infrared light. Thus, the accuracy of authentication, analysis, diagnosis, or the like can be improved. In addition, with an electronic device for security use, military use, or the like, image capturing using near-infrared light can be conducted unnoticeably.

FIG. 4A illustrates a biometric authentication apparatus for sensing a finger vein which includes a housing 911, a light source 912, a sensing stage 913, and the like. By putting a finger on the sensing stage 913, an image of a vein pattern can be taken. The light source 912 that emits near-infrared light is provided above the sensing stage 913, and an imaging device 914 is provided under the sensing stage 913. The sensing stage 913 is formed of a material that transmits near-infrared light, and near-infrared light that is emitted from the light source 912 and passes through the finger can be captured by the imaging device 914. Note that an optical system may be provided between the sensing stage 913 and the imaging device 914. The structure of the apparatus described above can also be used for a biometric authentication apparatus for sensing a palm vein.

The light-emitting device of one embodiment of the present invention can be used for the light source 912. The light-emitting device of one embodiment of the present invention can be provided to be curved and can emit light uniformly toward a target. In particular, the light-emitting device preferably emits near-infrared light with the maximum peak intensity at a wavelength from 760 nm to 900 nm. An image is formed from received light that has passed through the finger, palm, or the like, whereby the position of the vein can be detected. This action can be utilized for biometric authentication. A combination with a global shutter system enables highly accurate sensing even for a moving target.

The light source 912 can include a plurality of light-emitting portions, such as light-emitting portions 915, 916, and 917 illustrated in FIG. 4B. The light-emitting portions 915, 916, and 917 may emit light having different wavelengths, or can emit light at different timings. Thus, by changing wavelengths and angles of light to be delivered, different images can be taken successively; hence, high level of security can be achieved using a plurality of images for the authentication.

FIG. 4C illustrates a biometric authentication apparatus for sensing a palm vein which includes a housing 921, operation buttons 922, a sensing portion 923, a light source 924 that emits near-infrared light, and the like. By holding a hand over the sensing portion 923, a palm vein pattern can be recognized. Furthermore, a security code or the like can be input with the operation buttons. The light source 924 is provided around the sensing portion 923 and irradiates a target (a hand) with light. Then, light reflected by the target enters the sensing portion 923. The light-emitting device of one embodiment of the present invention can be used for the light source 924. An imaging device 925 is provided directly under the sensing portion 923 and can capture an image of the target (an image of the whole hand). Note that an optical system may be provided between the sensing portion 923 and the imaging device 925. The structure of the apparatus described above can also be used for a biometric authentication apparatus for sensing a finger vein.

FIG. 4D illustrates a non-destructive testing apparatus which includes a housing 931, an operation panel 932, a transport mechanism 933, a monitor 934, a sensing unit 935, a light source 938 that emits near-infrared light, and the like. The light-emitting device of one embodiment of the present invention can be used for the light source 938. Inspection members 936 are transported to be the position directly under the sensing unit 935 by the transport mechanism 933. The inspection member 936 is irradiated with near-infrared light from the light source 938, and an image of the light passing therethrough is taken by an imaging device 937 provided in the sensing unit 935. The taken image is displayed on the monitor 934. After that, the inspection members 936 are transported to the exit of the housing 931, and a defective member is separately collected. Imaging with the use of near-infrared light enables non-destructive and high-speed sensing of defective elements inside the inspection member, such as defects and foreign substances.

FIG. 4E illustrates a mobile phone which includes a housing 981, a display portion 982, an operation button 983, an external connection port 984, a speaker 985, a microphone 986, a first camera 987, a second camera 988, and the like. The display portion 982 of the mobile phone includes a touch sensor. The housing 981 and the display portion 982 have flexibility. All operations including making a call and inputting text can be performed by touch on the display portion 982 with a finger, a stylus, or the like. The first camera 987 can take a visible light image, and the second camera 988 can take an infrared light image (a near-infrared light image). The mobile phone or the display portion 982 illustrated in FIG. 4E may include the light-emitting device of one embodiment of the present invention.

This embodiment can be combined with the other embodiments as appropriate.

EXAMPLE

In this example, light-emitting devices of one embodiment of the present invention were fabricated, and evaluation results thereof are described In this example, Device 1 to which one embodiment of the present invention is applied and Comparative Device 2 for comparison were fabricated as light-emitting devices, and evaluation results thereof are described.

Figure 5:
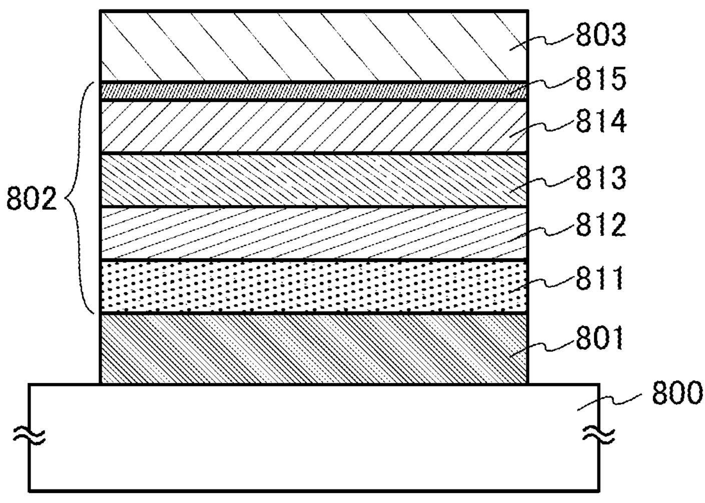
FIG. 5 is a cross-sectional view illustrating a light-emitting device in Example.

FIG. 5 illustrates the structure of Device 1 and Comparative Device 2 used in this example, and Table 1 shows specific components. The chemical formulae of the materials used in this example are shown below.

TABLE 1

| | First electrode 801 | Hole-injection layer 811 | Hole-transport layer 812 | Light-emitting layer 813 | Electron-transport layer 814 | | Electron-injection layer 815 | Second electrode 803 |
|---|---|---|---|---|---|---|---|---|
| Device 1 | ITSO (70 nm) | DBT3P-II:MoO$x$ (2:1 120 nm) | PCBBiF (20 nm) | * | 2,8mDBtP2Bfqn (20 nm) | NBphen (70 nm) | LiF (1 nm) | Al (200 nm) |
| Comparative Device 2 | ITSO (110 nm) | DBT3P-II:MoO$x$ (2:1 60 nm) | PCBBiF (20 nm) | ** | 2mDBTBPDBq-II (20 nm) | NBphen (70 nm) | LiF (1 nm) | Al (200 nm) |

* 2,8mDBtP2Bfqn:m-MTDATA:[Ir(dmdpbq)$_2$(dpm)] (0.7:0.3:0.1 40 nm)
** 2mDBTBPDBq-II:PCBBiF:[Ir(dmdpbq)$_2$(dpm)] (0.7:0.3:0.1 40 nm)

[Chemical Formula 1]

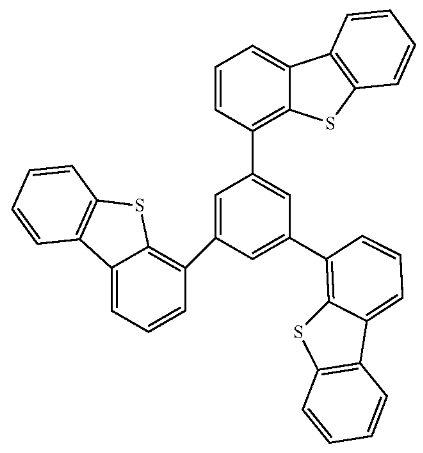

DBT3P-II

-continued

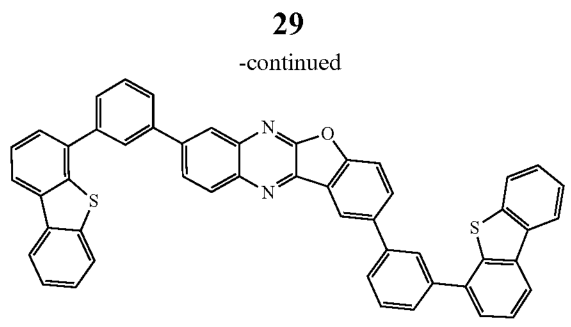

2,8mDBtP2Bfqn

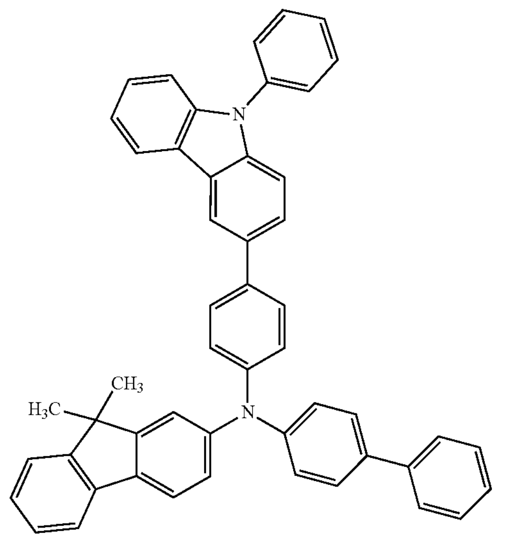

PCBBiF

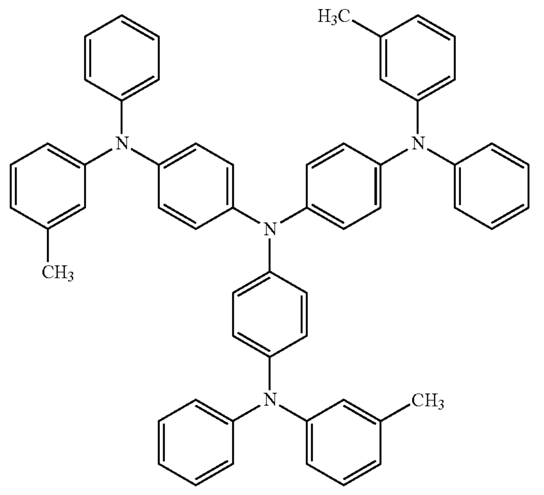

m-MTDATA

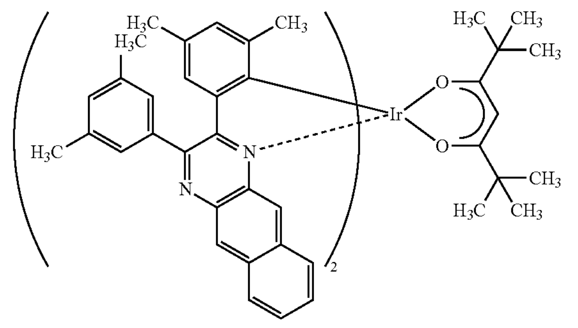

[Ir(dmdpbq)$_2$(dpm)]

-continued

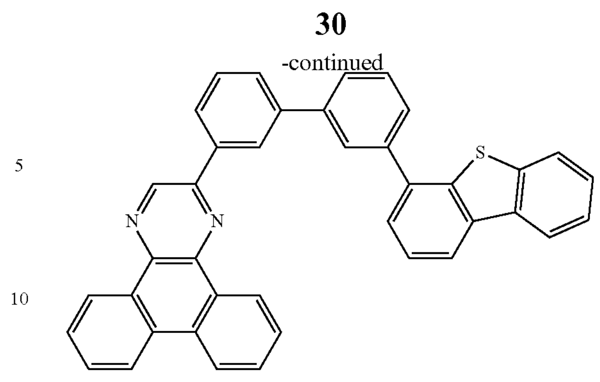

2mDBTBPDBq-II

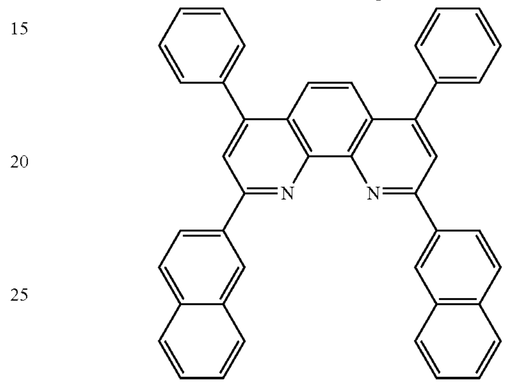

NBphen

<<Fabrication of Devices>>

Device 1 and Comparative Device 2 described in this example each have a structure as illustrated in FIG. 5, in which a first electrode 801 is formed over a substrate 800; as an EL layer 802, a hole-injection layer 811, a hole-transport layer 812, a light-emitting layer 813, an electron-transport layer 814, and an electron-injection layer 815 are stacked in this order over the first electrode 801; and a second electrode 803 is stacked over the electron-injection layer 815.

First, the first electrode 801 was formed over the substrate 800. The electrode area was set to 4 $mm^2$ (2 mm×2 mm). A glass substrate was used as the substrate 800. The first electrode 801 was formed by a sputtering method using indium tin oxide containing silicon oxide (ITSO). The thickness of the first electrode 801 was set to 70 nm in Device 1 and 110 nm in Comparative Device 2. In this example, the first electrode 801 functions as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to about $1\times10^{-4}$ Pa, vacuum baking at 170° C. for 30 minutes was performed in a heating chamber in the vacuum evaporation apparatus, and then the substrate was naturally cooled down for about 30 minutes.

Next, the hole-injection layer 811 was formed over the first electrode 801. For the formation of the hole-injection layer 811, the pressure in the vacuum evaporation apparatus was reduced to about $1\times10^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=2:1 (weight ratio). The thickness of the hole-injection layer 811 was set to 120 nm in Device 1 and 60 nm in Comparative Device 2.

Then, the hole-transport layer 812 was formed over the hole-injection layer 811. The hole-transport layer 812 was formed to a thickness of 20 nm by evaporation using N-(1,1'-biphenyl-4-yl)-N-[4-(9-phenyl-9H-carbazol-3-yl)phenyl]-9,9-dimethyl-9H-fluoren-2-amine (abbreviation: PCBBiF).

Next, the light-emitting layer 813 was formed over the hole-transport layer 812.

In Device 1, co-evaporation was performed using 2,8-bis[3-(dibenzothiophen-4-yl)phenyl]benzofuro[2,3-b]quinoxaline (abbreviation: 2,8mDBtP2Bfqn) and 4,4',4"-tris[N-(3-methylphenyl)-N-phenylamino]triphenylamine (abbreviation: m-MTDATA) as host materials and bis{4,6-dimethyl-2-[3-(3,5-dimethylphenyl)-2-benzo[g]quinoxalinyl-κN]phenyl-κC}(2,2,6,6-tetramethyl-3,5-heptanedionato-$κ^2$O,O')iridium(III) (abbreviation: $[Ir(dmdpbq)_2(dpm)]$) as a guest material (phosphorescent material) such that the weight ratio was 2,8mDBtP2Bfqn:m-MTDATA:$[Ir(dmdpbq)_2(dpm)]$=0.7:0.3:0.1. The thickness of the light-emitting layer 813 was set to 40 nm.

In Comparative Device 2, co-evaporation was performed using 2-[3'-(dibenzothiophen-4-yl)biphenyl-3-yl]dibenzo[f,h]quinoxaline (abbreviation: 2mDBTBPDBq-II) and PCBBiF as host materials and $[Ir(dmdpbq)_2(dpm)]$ as a guest material (phosphorescent material) such that the weight ratio was 2mDBTBPDBq-II:PCBBiF:$[Ir(dmdpbq)_2(dpm)]$=0.7:0.3:0.1. The thickness of the light-emitting layer 813 was set to 40 nm.

Next, the electron-transport layer 814 was formed over the light-emitting layer 813.

The electron-transport layer 814 of Device 1 was formed by sequential evaporation such that the thickness of 2,8mDBtP2Bfqn was 20 nm and the thickness of 2,9-bis(naphthalen-2-yl)-4,7-diphenyl-1,10-phenanthroline (abbreviation: NBphen) was 70 nm.

The electron-transport layer 814 of Comparative Device 2 was formed by sequential evaporation such that the thickness of 2mDBTBPDBq-II was 20 nm and the thickness of NBphen was 70 nm.

Then, the electron-injection layer 815 was formed over the electron-transport layer 814. The electron-injection layer 815 was formed to a thickness of 1 nm by evaporation using lithium fluoride (LiF).

After that, the second electrode 803 was formed over the electron-injection layer 815. The second electrode 803 was formed to a thickness of 200 nm by an evaporation method using aluminum. In this example, the second electrode 803 functions as a cathode.

Through the above steps, the light-emitting devices in each of which the EL layer 802 was provided between the pair of electrodes over the substrate 800 were fabricated. The hole-injection layer 811, the hole-transport layer 812, the light-emitting layer 813, the electron-transport layer 814, and the electron-injection layer 815 described in the above steps are functional layers forming the EL layer in one embodiment of the present invention. Furthermore, in all the evaporation steps in the above fabrication method, an evaporation method by a resistance-heating method was used.

The light-emitting device fabricated as described above was sealed using a different substrate (not illustrated). At the time of the sealing using the different substrate (not illustrated), the different substrate (not illustrated) on which an adhesive that is solidified by ultraviolet light was applied was fixed onto the substrate 800 in a glove box containing a nitrogen atmosphere, and the substrates were bonded to each other such that the adhesive was attached to the periphery of the light-emitting device formed over the substrate 800. At the time of the sealing, the adhesive was irradiated with 365-nm ultraviolet light at 6 $J/cm^2$ to be solidified, and the adhesive was subjected to heat treatment at 80° C. for one hour to be stabilized.

<<Operation Characteristics of Light-Emitting Devices>>

Operation characteristics of Device 1 and Comparative Device 2 were measured. Note that the measurement was carried out at room temperature (in an atmosphere maintained at 25° C.).

Figure 6:
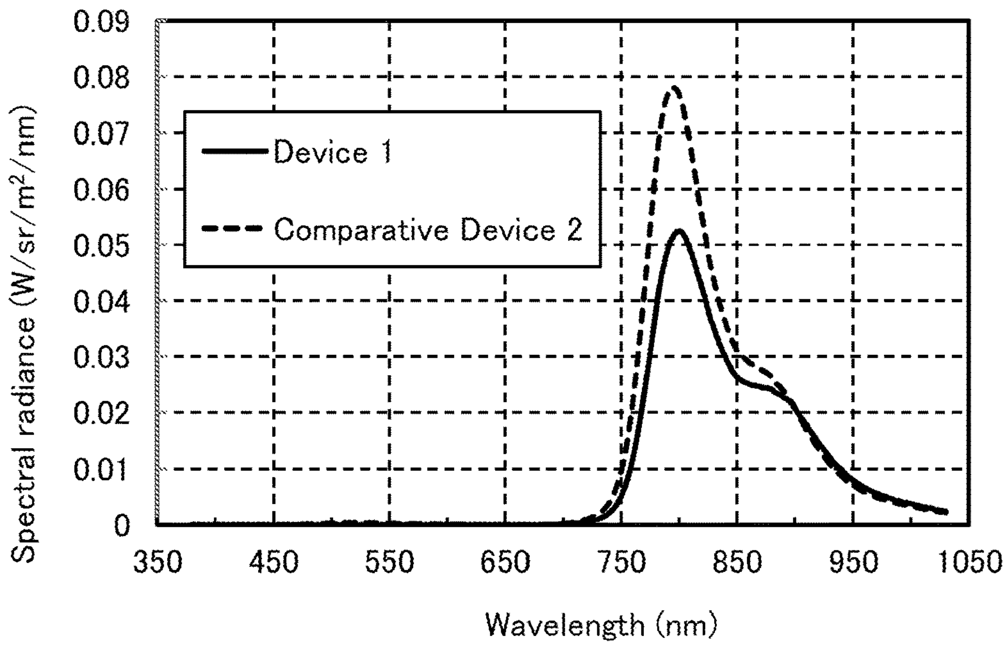
FIG. 6 is a graph showing emission spectra of light-emitting devices in Example.
Figure 7:
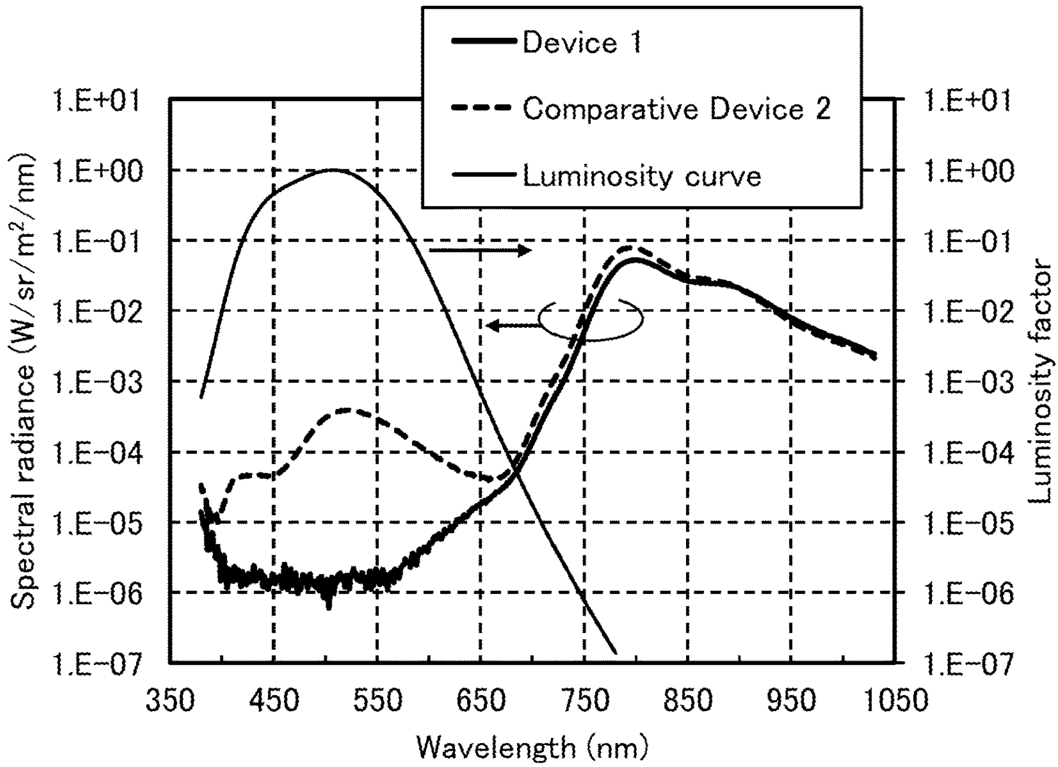
FIG. 7 is a graph showing emission spectra of the light-emitting devices in Example.

FIG. 6 and FIG. 7 show emission spectra when current at a current density of 50 $mA/cm^2$ was supplied to Device 1 and Comparative Device 2. Emission spectra in a wavelength range of greater than or equal to 380 nm and less than or equal to 749 nm are measurement results obtained with a spectroradiometer (SR-UL1R manufactured by TOPCON TECHNOHOUSE CORPORATION) and emission spectra in a wavelength range of greater than or equal to 750 nm and less than or equal to 1030 nm are measurement results obtained with a near-infrared spectroradiometer (SR-NIR manufactured by TOPCON TECHNOHOUSE CORPORATION). FIG. 7 is different from FIG. 6 in that the vertical axis is on a logarithmic scale. Furthermore, FIG. 7 also shows a luminosity curve based on scotopic luminosity (CIE (1951) Scotopic V'(λ)).

Table 2 shows the initial values of main characteristics of Device 1 and Comparative Device 2 at a current of 2 mA (a current density of 50 $mA/cm^2$). Note that the radiant flux and the external quantum efficiency were calculated using the radiance, assuming that the light-emitting devices had Lambertian light-distribution characteristics.

TABLE 2

| | Voltage (V) | Current (mA) | Current density ($mA/cm^2$) | Luminance ($cd/m^2$) | Radiance ($W/sr/m^2$) | Luminance/Radiance (cd · sr/W) | Radiant flux (mW) | External quantum efficiency (%) |
|---|---|---|---|---|---|---|---|---|
| Device 1 | 6.5 | 2.00 | 50 | 0.28 | 5.8 | 0.05 | 0.07 | 2.5 |
| Comparative Device 2 | 5.8 | 2.00 | 50 | 16 | 7.5 | 2.1 | 0.09 | 3.1 |

Here, as is to be described in Reference Example (FIG. 13), the PL spectrum of $[Ir(dmdpbq)_2(dpm)]$ in a dichloromethane solution had a maximum peak at 807 nm (1.54 eV). The maximum peak rose at 754 nm (1.64 eV) on a short wavelength side.

As shown in FIG. 6, the maximum peak wavelength in the emission spectrum of Device 1 was 801 nm and the maximum peak wavelength in the emission spectrum of Comparative Device 2 was 793 nm. It was found that both the devices emitted near-infrared light derived from $[Ir(dmdpbq)_2(dpm)]$ contained in the light-emitting layer 813.

The rising wavelength of the maximum peak on a short wavelength side was 754 nm in the emission spectrum of Device 1 shown in FIG. 6. The rising wavelength of the maximum peak on a short wavelength side was 751 nm in the emission spectrum of Comparative Device 2. It was found that Device 1 and Comparative Device 2 each had a sufficiently long rising wavelength of the maximum peak on a short wavelength side.

As shown in FIG. 7, it was confirmed that the emission spectrum of Comparative Device 2 had a relatively large emission peak (a peak wavelength of 523 nm) in the visible light wavelength range. It was found from comparison with the luminosity curve that the light emitted from Comparative Device 2 included light in a wavelength range of a high luminosity factor of visible light. That is, visible light emitted from Comparative Device 2 is easily seen. In contrast, Device 1 had a lower spectral radiance in the visible light wavelength range than Comparative Device 2. The maximum peak wavelength in the visible light wavelength range in the emission spectrum of Device 1 was 638 nm, and the emission spectrum of Device 1 had a peak in a wavelength range of a low luminosity factor of visible light. Accordingly, it was found that Device 1 emitted visible light in a wavelength range of a low luminosity factor and had a low emission intensity in the visible light wavelength range.

As shown in Table 2, luminance/radiance (a value obtained by dividing a value of luminance by a value of radiance) of Device 1 was 0.05 cd·sr/W, and luminance/radiance of Comparative Device 2 was 2.1 cd·sr/W. Accordingly, it was found that Device 1 had an extremely low emission intensity of visible light with respect to the emission intensity of near-infrared light. Thus, it can be said that Device 1 emits near-infrared light and emits visible light that is less likely to be seen. In contrast, Comparative Device 2 has a high emission intensity of visible light with respect to the emission intensity of near-infrared light, and thus, it can be said that visible light is easily seen.

As shown in Table 2, the external quantum efficiency of Device 1 was 2.5%. It can be said that this external quantum efficiency has a high value as the external quantum efficiency of a light-emitting device that has a low emission intensity of visible light and mainly emits near-infrared light. Note that the external quantum efficiency of Device 1 was calculated from the measurement result in a wavelength range of 600 nm to 1030 nm inclusive, which was obtained with a near-infrared spectroradiometer (SR-NIR manufactured by TOPCON TECHNOHOUSE CORPORATION).

Mixed Film A of the two host materials used in Device 1 and Mixed Film B of the two host materials used in Comparative Device 2 were formed, and emission spectra (PL spectra) of the films were measured.

Mixed Film A was formed over a quartz substrate to have a thickness of 50 nm by co-evaporation of 2,8mDBtP2Bfqn and m-MTDATA in 2,8mDBtP2Bfqn:m-MTDATA=0.7:0.3 (weight ratio). Here, 2,8mDBtP2Bfqn and m-MTDATA form an exciplex in combination.

Mixed Film B was formed over a quartz substrate to have a thickness of 50 nm by co-evaporation of 2mDBTBPDBq-II and PCBBiF in 2mDBTBPDBq-II:PCBBiF=0.7:0.3 (weight ratio). Here, 2mDBTBPDBq-II and PCBBiF form an exciplex in combination.

Table 3 shows the HOMO levels and the LUMO levels of the host materials. Note that the HOMO levels and the LUMO levels were derived from the electrochemical characteristics (the reduction potentials and the oxidation potentials) of the materials that were measured by cyclic voltammetry (CV). Table 3 also shows the HOMO level and the LUMO level of the guest material used in Device 1 and Comparative Device 2.

TABLE 3

| | | HOMO (eV) | LUMO (eV) |
|---|---|---|---|
| Device 1 | 2,8mDBtP2Bfqn | −6.20 | −3.31 |
| Mixed Film A | m-MTDATA | −4.98 | −2.22 |
| Comparative Device 2 | 2mDBTBPDBq-II | −6.22 | −2.94 |
| Mixed Film B | PCBBiF | −5.36 | −2.00 |
| Guest material | $Ir(dmdpbq)_2(dpm)$ | −5.54 | −3.49 |

The HOMO levels and the LUMO levels of the two host materials used in Device 1 and Mixed Film A are described with Table 3. It is found that the HOMO level of m-MTDATA is higher than both the HOMO level of [$Ir(dmdpbq)_2$(dpm)] and the HOMO level of 2,8mDBtP2Bfqn. Specifically, the HOMO level (−4.98 eV) of m-MTDATA is higher than the HOMO level (−5.54 eV) of [$Ir(dmdpbq)_2$(dpm)] by 0.56 eV. In addition, a difference between the HOMO level (−4.98 eV) of m-MTDATA and the LUMO level (−3.31 eV) of 2,8mDBtP2Bfqn is 1.67 eV, which is smaller than a difference (2.05 eV) between the HOMO level (−5.54 eV) and the LUMO level (−3.49 eV) of [$Ir(dmdpbq)_2$(dpm)].

Next, the HOMO levels and the LUMO levels of the two host materials used in Comparative Device 2 and Mixed Film B are described with Table 3. It is found that the HOMO level of PCBBiF is higher than both the HOMO level of [$Ir(dmdpbq)_2$(dpm)] and the HOMO level of 2mDBTBPDBq-II. Specifically, the HOMO level (−5.36 eV) of PCBBiF is higher than the HOMO level (−5.54 eV) of [$Ir(dmdpbq)_2$(dpm)] by 0.18 eV. In addition, a difference between the HOMO level (−5.36 eV) of PCBBiF and the LUMO level (−2.94 eV) of 2mDBTBPDBq-II is 2.42 eV, which is larger than the difference (2.05 eV) between the HOMO level (−5.54 eV) and the LUMO level (−3.49 eV) of [$Ir(dmdpbq)_2$(dpm)].

The PL spectra were measured with a fluorophotometer (FS920 manufactured by Hamamatsu Photonics K.K.) at room temperature.

Figure 8:
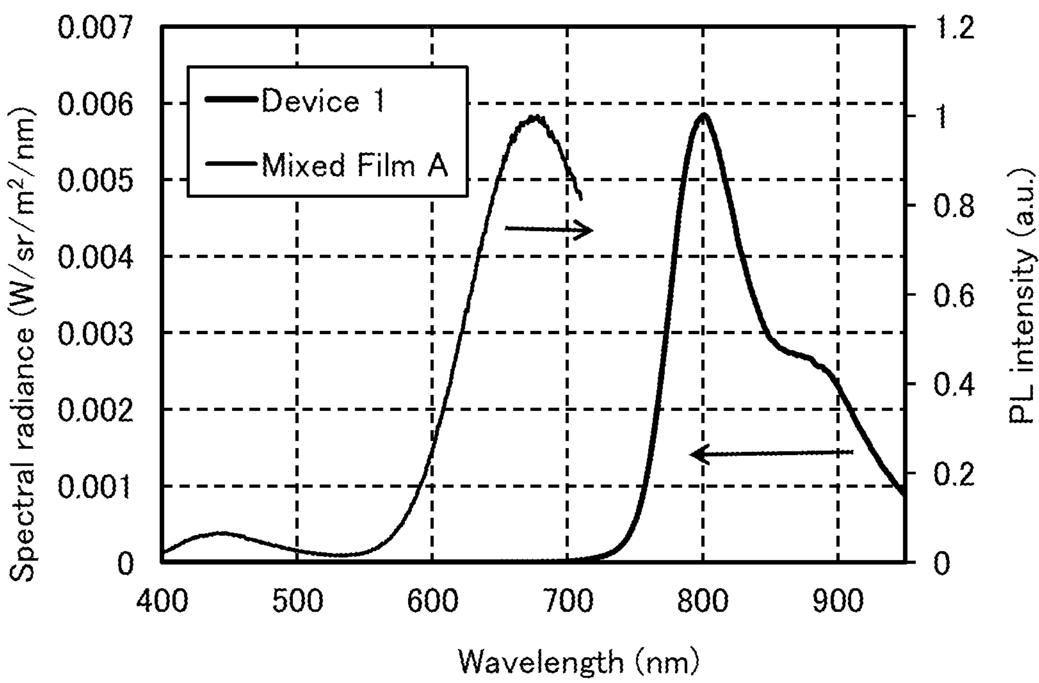
FIG. 8 is a graph showing emission spectra of the light-emitting device and a mixed film in Example.
Figure 9:
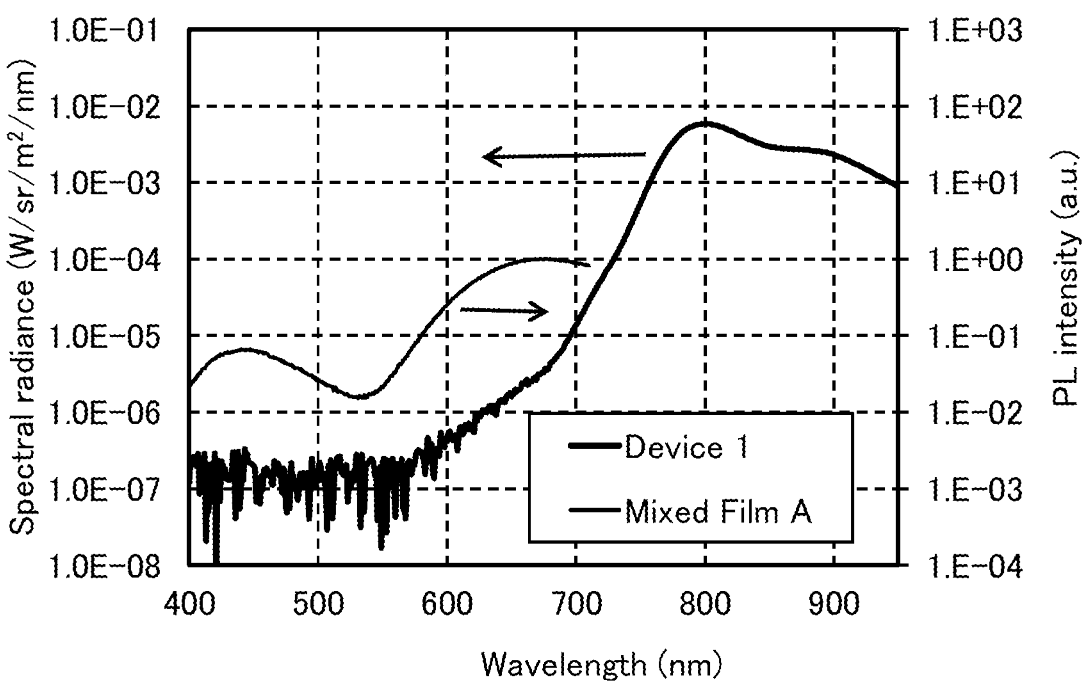
FIG. 9 is a graph showing emission spectra of the light-emitting device and the mixed film in Example.

FIG. 8 and FIG. 9 show the PL spectrum of Mixed Film A and the emission spectrum of Device 1 (similar to that in FIG. 6 and FIG. 7). FIG. 9 is different from FIG. 8 in that the vertical axis is on a logarithmic scale.

Figure 10:
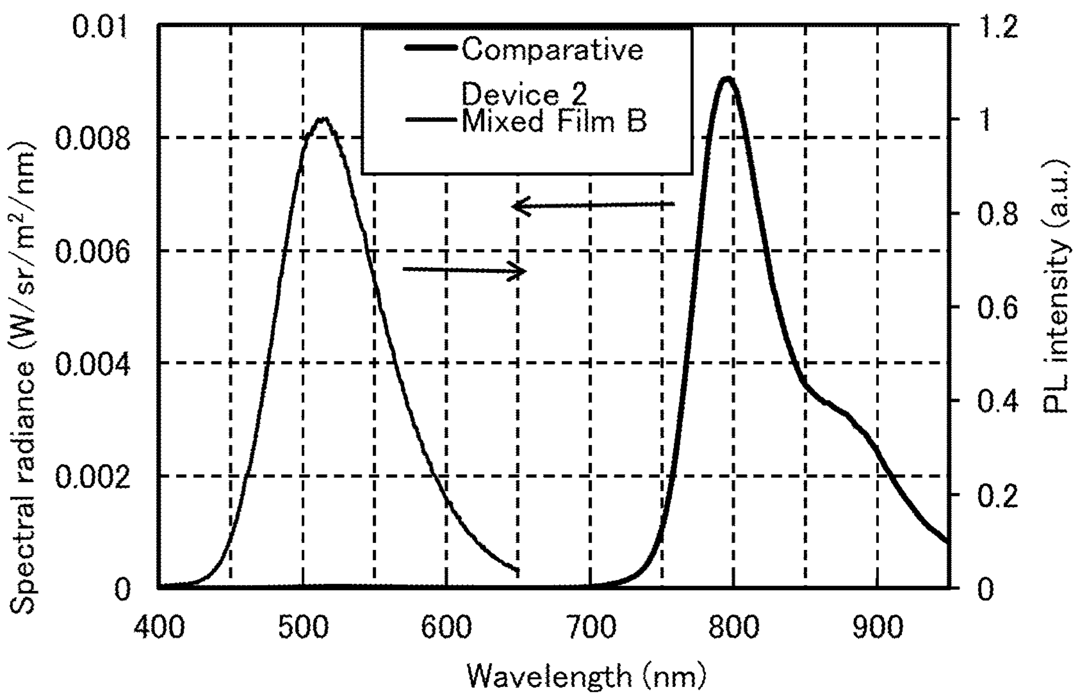
FIG. 10 is a graph showing emission spectra of the light-emitting device and a mixed film in Example.
Figure 11:
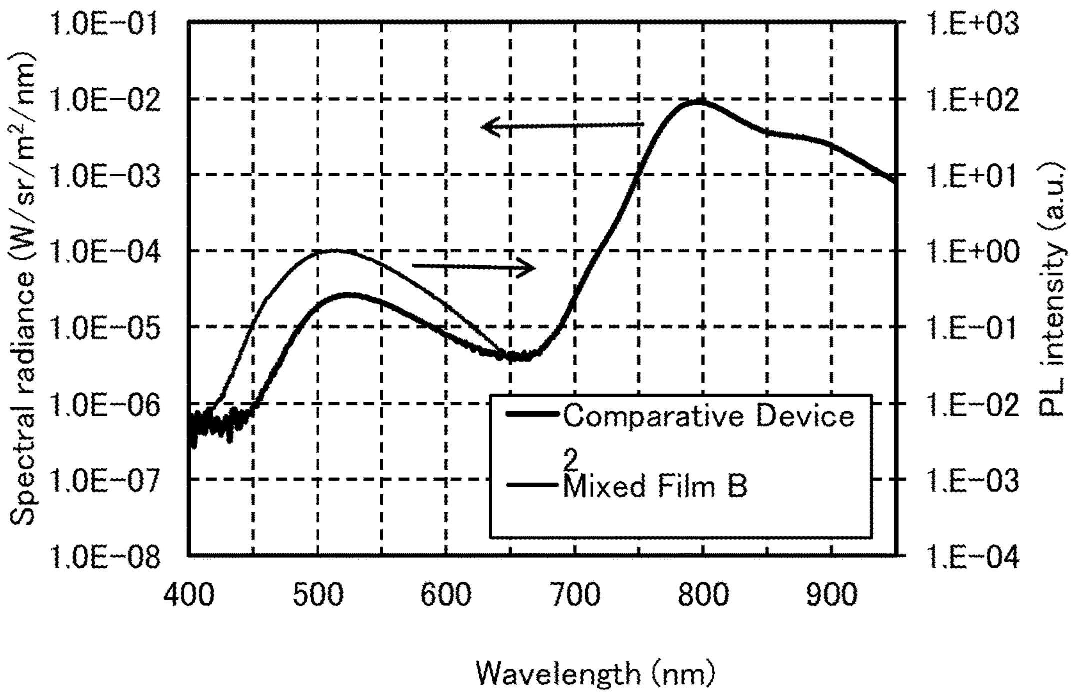
FIG. 11 is a graph showing emission spectra of the light-emitting device and the mixed film in Example.

FIG. 10 and FIG. 11 show the PL spectrum of Mixed Film B and the emission spectrum of Comparative Device 2 (similar to that in FIG. 6). FIG. 11 is different from FIG. 10 in that the vertical axis is on a logarithmic scale.

As shown in FIG. 8, the maximum peak wavelength in the PL spectrum of Mixed Film A was 678 nm. From the difference between the HOMO level of m-MTDATA and the LUMO level of 2,8mDBtP2Bfqn, it can be said that light emission of Mixed Film A is light emission derived from the exciplex formed by these two materials.

As shown in FIG. 10, the maximum peak wavelength in the PL spectrum of Mixed Film B was 516 nm. From the difference between the HOMO level of PCBBiF and the LUMO level of 2mDBTBPDBq-II, it can be said that light emission of Mixed Film B is light emission derived from the exciplex formed by these two materials.

Since the emission peak wavelength in the visible light range of Comparative Device 2 is close to the maximum peak wavelength in the PL spectrum of Mixed Film B, it is demonstrated that the visible light emission observed in Comparative Device 2 was light emission derived from the exciplex formed by the two host materials.

The maximum peak wavelength in the PL spectrum of Mixed Film A is included in a wavelength range of a low luminosity factor. Thus, light derived from the exciplex formed by the two host materials used in Mixed Film A has a low luminosity factor. Accordingly, Device 1 is a light-emitting device in which light derived from the exciplex is less likely to be seen and visible light is less likely to be seen.

As described above, the HOMO level of m-MTDATA used in Mixed Film A is higher than the HOMO level of [Ir(dmdpbq)$_2$(dpm)] by 0.56 eV. The difference between the HOMO level of m-MTDATA and the LUMO level of 2,8mDBtP2Bfqn is smaller than the difference between the HOMO level and the LUMO level of [Ir(dmdpbq)$_2$(dpm)]. Thus, light emitted from the exciplex formed by these two materials can have a long wavelength and a low luminosity factor.

As described above, it was found from this example that by making light emitted from an exciplex formed by two host materials have a wavelength of a low luminosity factor, a light-emitting device that emits near-infrared light and emits visible light that is less likely to be seen can be fabricated.

REFERENCE EXAMPLE

A method for synthesizing bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ$^2$O,O')iridium (III) (abbreviation: [Ir(dmdpbq)$_2$(dpm)]) that was used in Example above will be specifically described. The structure of [Ir(dmdpbq)$_2$(dpm)] is shown below.

[Chemical Formula 2]

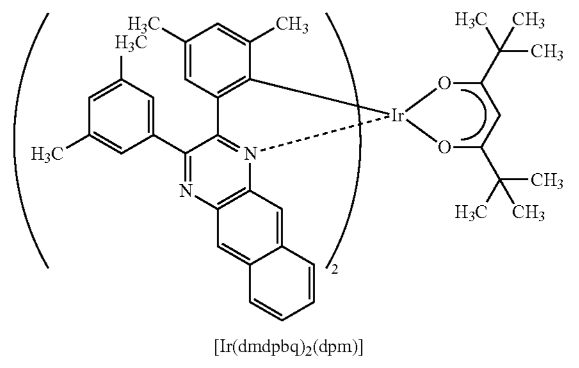

[Ir(dmdpbq)$_2$(dpm)]

Step 1; Synthesis of 2,3-bis-(3,5-dimethylphenyl)-2-benzo[g]quinoxaline (Abbreviation: Hdmdpbq)

First, in Step 1, Hdmdpbq was synthesized. Into a three-neck flask equipped with a reflux pipe, 3.20 g of 3,3',5,5'-tetramethylbenzyl, 1.97 g of 2,3-diaminonaphthalene, and 60 mL of ethanol were put, the air in the flask was replaced with nitrogen, and then the mixture was stirred at 90° C. for 7.5 hours. After a predetermined time elapsed, the solvent was distilled off Then, purification by silica gel column chromatography using toluene as a developing solvent was performed, whereby the target substance was obtained (a yellow solid, yield: 3.73 g, percent yield: 79%). The synthesis scheme of Step 1 is shown in (a-1).

[Chemical Formula 3]

(a-1)

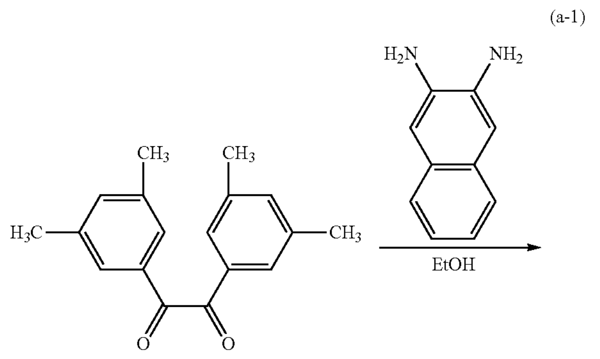

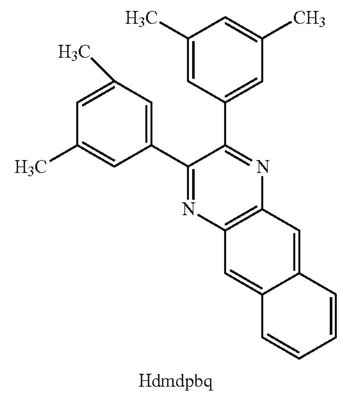

Hdmdpbq

Analysis results by nuclear magnetic resonance spectroscopy ($^1$H-NMR) of the yellow solid obtained in Step 1 are shown below. The analysis results revealed that Hdmdpbq was obtained.

Given below is $^1$H NMR data of the obtained substance.

$^1$H-NMR. δ ($CD_2Cl_2$): 2.28 (s, 12H), 7.01 (s, 2H), 7.16 (s, 4H), 7.56-7.58 (m, 2H), 8.11-8.13 (m, 2H), 8.74 (s, 2H).

Step 2; Synthesis of di-μ-chloro-tetrakis {4,6-dimethyl-2-[3-(3,5-dimethylphenyl)-2-benzo[g]quinoxalinyl-κN]phenyl-κC}diiridium(III) (Abbreviation: [Ir(dmdpbq)$_2$Cl]$_2$)

Next, in Step 2, [Ir(dmdpbq)$_2$Cl]$_2$ was synthesized. Into a recovery flask equipped with a reflux pipe, 15 mL of 2-ethoxyethanol, 5 mL of water, 1.81 g of Hdmdpbq obtained in Step 1, and 0.66 g of iridium chloride hydrate ($IrCl_3 \cdot H_2O$) (produced by Furuya Metal Co., Ltd.) were put, and the air in the flask was replaced with argon. Then, microwave irradiation (2.45 GHz, 100 W) was performed for two hours to cause reaction. After a predetermined time elapsed, the obtained residue was suction-filtered and washed with methanol, whereby the target substance was obtained (a black solid, yield: 1.76 g, percent yield: 81%). The synthesis scheme of Step 2 is shown in (a-2).

[Chemical Formula 4]

(a-2)

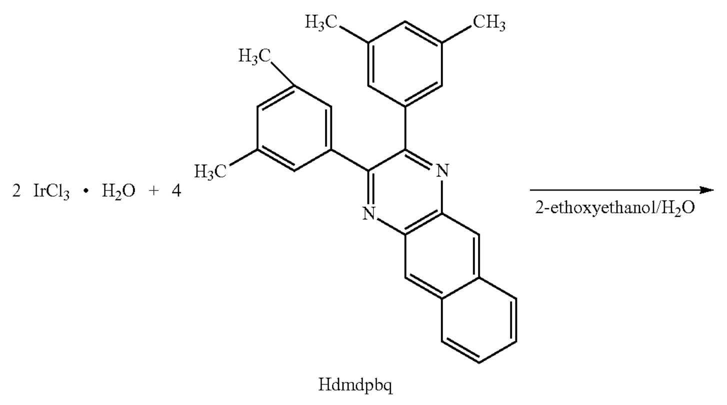

Hdmdpbq

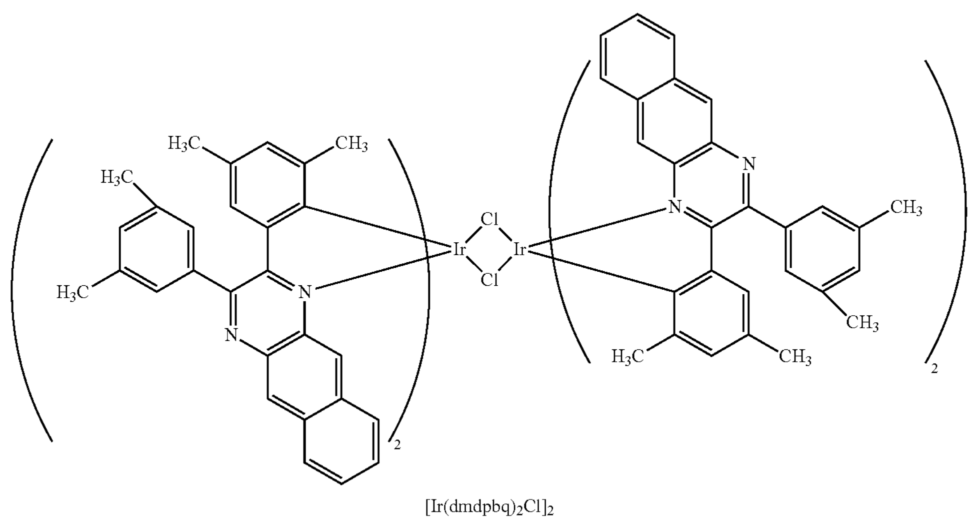

$[Ir(dmdpbq)_2Cl]_2$

Step 3; Synthesis of $[Ir(dmdpbq)_2(dpm)]$

Then, in Step 3, $[Ir(dmdpbq)_2(dpm)]$ was synthesized. Into a recovery flask equipped with a reflux pipe, 20 mL of 2-ethoxyethanol, 1.75 g of $[Ir(dmdpbq)_2Cl]_2$ obtained in Step 2, 0.50 g of dipivaloylmethane (abbreviation: Hdpm), and 0.95 g of sodium carbonate were put, and the air in the flask was replaced with argon. Then, microwave irradiation (2.45 GHz, 100 W) was performed for three hours. The obtained residue was suction-filtered with methanol and then washed with water and methanol. The obtained solid was purified by silica gel column chromatography using dichloromethane as a developing solvent, and then recrystallization was performed with a mixed solvent of dichloromethane and methanol, whereby the target substance was obtained (a dark green solid, yield: 0.42 g, percent yield: 21%). With a train sublimation method, 0.41 g of the obtained dark green solid was purified by sublimation. The conditions of the sublimation purification were such that the dark green solid was heated under a pressure of 2.7 Pa at 300° C. while the argon gas flowed at a flow rate of 10.5 mL/min. After the sublimation purification, a dark green solid was obtained in a percent yield of 78%. The synthesis scheme of Step 3 is shown in (a-3).

[Chemical Formula 5]

(a-3)

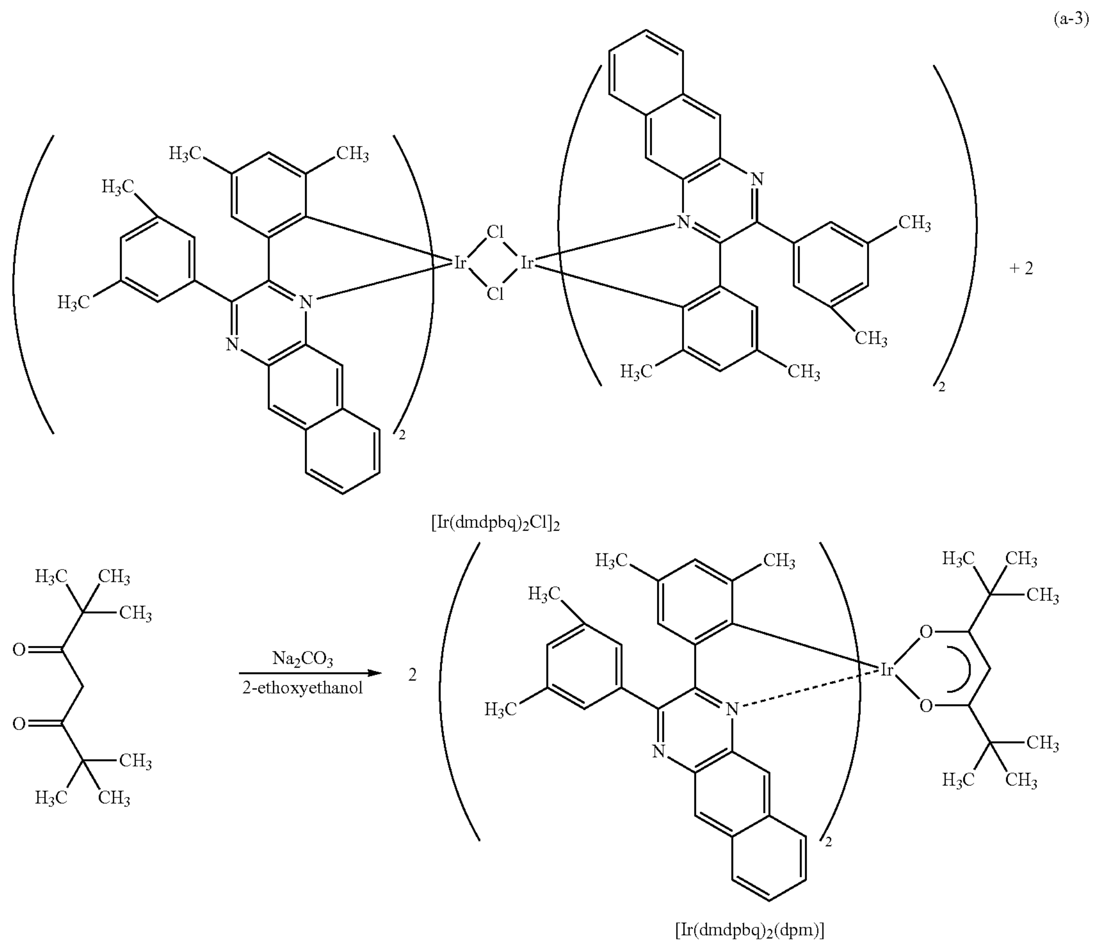

[Ir(dmdpbq)$_2$Cl]$_2$

[Ir(dmdpbq)$_2$(dpm)]

Analysis results by nuclear magnetic resonance spectroscopy ($^1$H-NMR) of the dark green solid obtained in Step 3 are shown below. The analysis results revealed that [Ir(dmdpbq)$_2$(dpm)] was obtained.

$^1$H-NMR. δ ($CD_2Cl_2$): 0.75 (s, 18H), 0.97 (s, 6H), 2.01 (s, 6H), 2.52 (s, 12H), 4.86 (s, 1H), 6.39 (s, 2H), 7.15 (s, 2H), 7.31 (s, 2H), 7.44-7.51 (m, 4H), 7.80 (d, 2H), 7.86 (s, 4H), 8.04 (d, 2H), 8.42 (s, 2H), 8.58 (s, 2H).

Figure 12:
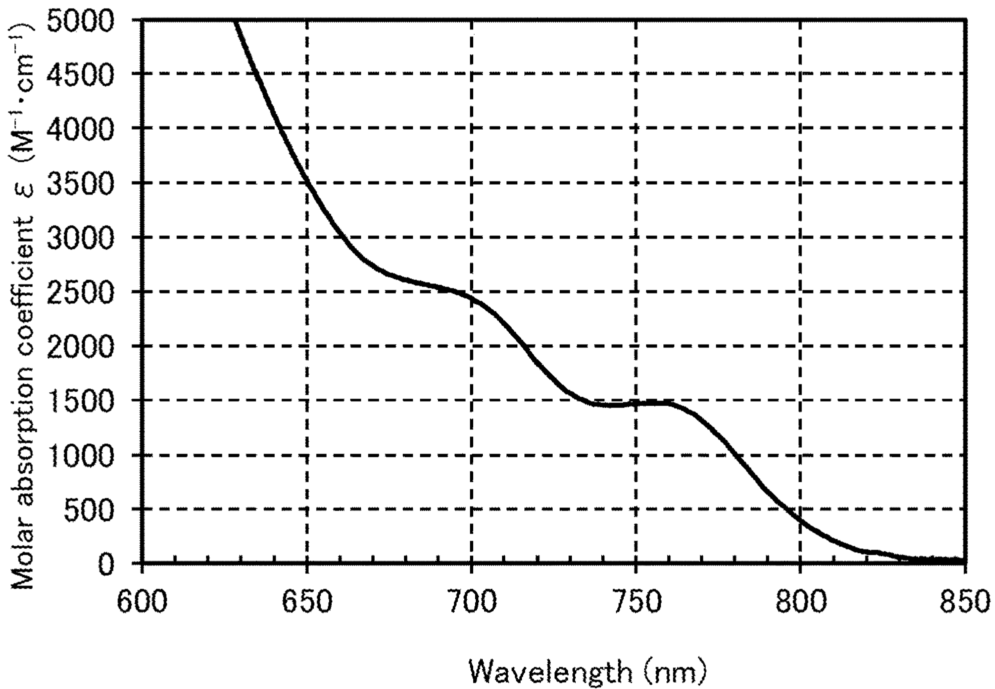
FIG. 12 is a graph showing an absorption spectrum of $[Ir(dmdpbq)_2(dpm)]$.
Figure 13:
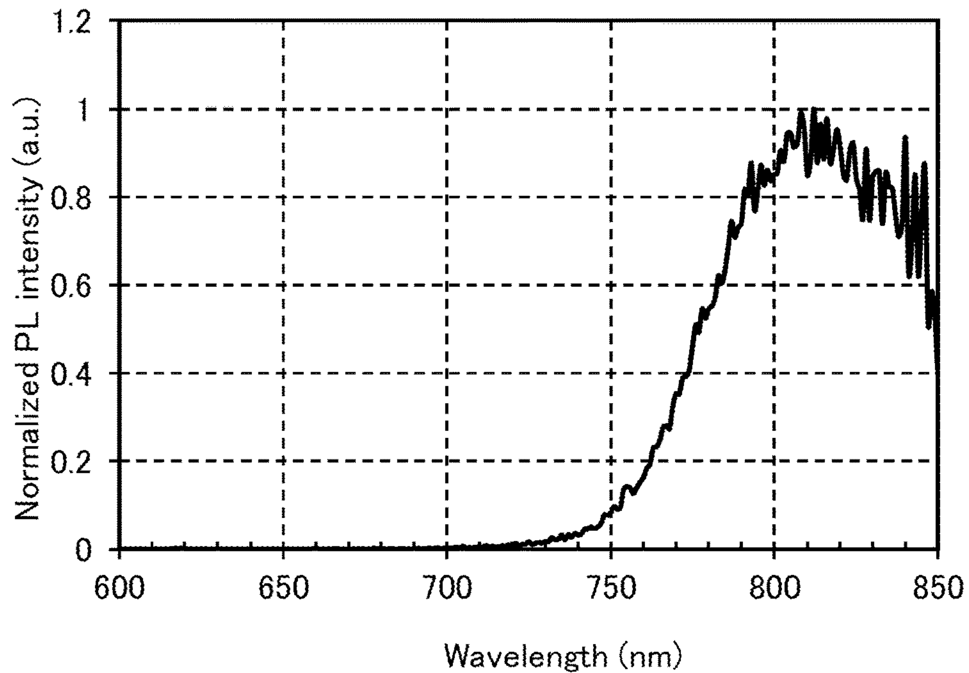
FIG. 13 is a graph showing an emission spectrum of $[Ir(dmdpbq)_2(dpm)]$.

Next, FIG. 12 and FIG. 13 show the measurement results of an ultraviolet-visible absorption spectrum (hereinafter simply referred to as an "absorption spectrum") and an emission spectrum (PL spectrum) of [Ir(dmdpbq)$_2$(dpm)] in a dichloromethane solution.

The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the deoxygenated dichloromethane solution (0.010 mmol/L) was put and hermetically sealed into a quartz cell in a nitrogen atmosphere.

The absorption spectrum shown in FIG. 12 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 13, [Ir(dmdpbq)$_2$(dpm)] had an emission peak at 807 nm (1.54 eV), and near-infrared light was observed from the dichloromethane solution. The emission peak rose at 754 nm (1.64 eV).

REFERENCE NUMERALS

101: first electrode, 102: second electrode, 103: EL layer, 103*a*: EL layer, 103*b*: EL layer, 104: charge-generation layer, 111: hole-injection layer, 112: hole-transport layer, 113: light-emitting layer, 114: electron-transport layer, 115: electron-injection layer, 301: substrate, 302: pixel portion, 303: circuit portion, 304*a*: circuit portion, 304*b*: circuit portion, 305: sealant, 306: substrate, 307: wiring, 308: FPC, 309: transistor, 310: transistor, 311: transistor, 312: transistor, 313: first electrode, 314: insulating layer, 315: EL layer, 316: second electrode, 317: organic EL device, 318: space, 401: first electrode, 402: EL layer, 403: second electrode, 405: insulating layer, 406: conductive layer, 407: adhesive layer, 416: conductive layer, 420: substrate, 422: adhesive layer, 423: barrier layer, 424: insulating layer, 450: organic EL device, 490*a*: substrate, 490*b*: substrate, 490*c*: barrier layer, 800: substrate, 801: first electrode, 802: EL layer, 803: second electrode, 811: hole-injection layer, 812: hole-transport layer, 813: light-emitting layer, 814: electron-transport layer, 815: electron-injection layer, 911: housing, 912: light source, 913: sensing stage, 914: imaging device, 915: light-emitting portion, 916: light-emitting portion, 917: light-emitting portion, 921: housing, 922: operation button, 923: sensing portion, 924: light source, 925: imaging device, 931: housing, 932: operation panel, 933: transport mechanism, 934: monitor, 935: sensing unit, 936: inspection member, 937: imaging device, 938: light source, 981: housing, 982: display portion, 983: operation button, 984: external connection port, 985: speaker, 986: microphone, 987: camera, 988: camera.

This application is based on Japanese Patent Application Serial No. 2019-102034 filed on May 31, 2019, the entire contents of which are hereby incorporated herein by reference.

The invention claimed is:

1. A light-emitting device comprising a light-emitting layer, wherein the light-emitting layer comprises a light-emitting organic compound and a host material, wherein the light-emitting organic compound is a cyclometalated complex, wherein a maximum peak wavelength in an emission spectrum of the light-emitting device is greater than or equal to 750 nm and less than or equal to 900 nm, wherein emission characteristics of the light-emitting device includes a luminance A [$cd/m^2$] and a radiance B [$W/sr/m^2$], and wherein the luminance A [$cd/m^2$] and the radiance B [$W/sr/m^2$] satisfy $0<A/B<1$ [cd·sr/W].

2. A light-emitting device comprising a light-emitting layer, wherein the light-emitting layer comprises a light-emitting organic compound and a host material, wherein a maximum peak wavelength in an emission spectrum of the light-emitting device is greater than or equal to 750 nm and less than or equal to 900 nm, wherein emission characteristics of the light-emitting device includes a luminance A [$cd/m^2$] and a radiance B [$W/sr/m^2$], wherein the luminance A [$cd/m^2$] and the radiance B [$W/sr/m^2$] satisfy $0<A/B<1$ [cd·sr/W], and wherein a difference between a HOMO level of the host material and a LUMO level of the host material is greater than or equal to 1.35 eV and less than or equal to 2.25 eV.

3. A light-emitting device comprising a light-emitting layer, wherein the light-emitting layer comprises a light-emitting organic compound and a host material, wherein a maximum peak wavelength in an emission spectrum of the light-emitting device is greater than or equal to 750 nm and less than or equal to 900 nm, wherein emission characteristics of the light-emitting device includes a luminance A [$cd/m^2$] and a radiance B [$W/sr/m^2$], wherein the luminance A [$cd/m^2$] and the radiance B [$W/sr/m^2$] satisfy $0<A/B<1$ [cd·sr/W], wherein the host material comprises a first organic compound and a second organic compound, wherein a HOMO level of the first organic compound is higher than a HOMO level of the second organic compound, and wherein a difference between the HOMO level of the first organic compound and a LUMO level of the second organic compound is smaller than a difference between a HOMO level of the light-emitting organic compound and a LUMO level of the light-emitting organic compound.

4. The light-emitting device according to claim 3, wherein the first organic compound and the second organic compound are substances that form an exciplex.

5. The light-emitting device according to claim 3, wherein the difference between the HOMO level of the first organic compound and the LUMO level of the second organic compound is greater than or equal to 1.35 eV and less than or equal to 2.25 eV.

6. The light-emitting device according to claim 1, wherein a rising wavelength of the maximum peak on a short wavelength side in the emission spectrum is greater than or equal to 650 nm.

7. The light-emitting device according to claim 1, wherein a rising wavelength of a maximum peak on a short wavelength side in an emission spectrum of the light-emitting organic compound in a solution is greater than or equal to 650 nm.

8. The light-emitting device according to claim 1, wherein an external quantum efficiency of the light-emitting device is greater than or equal to 1%.

9. The light-emitting device according to claim 1, wherein the light-emitting organic compound is an organometallic complex having a metal-carbon bond.

10. The light-emitting device according to claim 9, wherein the organometallic complex comprises a condensed heteroaromatic ring including 2 to 5 rings, and wherein the condensed heteroaromatic ring is coordinated to the metal.

11. A light-emitting apparatus comprising:

the light-emitting device according to claim 1; and one or both of a transistor and a substrate.

12. A light-emitting module comprising:

the light-emitting apparatus according to claim 11; and one or both of a connector and an integrated circuit.

13. An electronic device comprising:

the light-emitting module according to claim 12; and at least one of an antenna, a battery, a housing, a camera, a speaker, a microphone, and an operation button.

14. A lighting device comprising:

the light-emitting apparatus according to claim 11; and at least one of a housing, a cover, and a support.

15. The light-emitting device according to claim 2, wherein the light-emitting organic compound is an organometallic complex having a metal-carbon bond.

16. The light-emitting device according to claim 15, wherein the organometallic complex comprises a condensed heteroaromatic ring including 2 to 5 rings, and wherein the condensed heteroaromatic ring is coordinated to the metal.

17. The light-emitting device according to claim 3, wherein the light-emitting organic compound is an organometallic complex having a metal-carbon bond.

18. The light-emitting device according to claim 17, wherein the organometallic complex comprises a condensed heteroaromatic ring including 2 to 5 rings, and wherein the condensed heteroaromatic ring is coordinated to the metal.

* * * * *